US012119368B2

(12) United States Patent
Lee et al.

(10) Patent No.: US 12,119,368 B2
(45) Date of Patent: Oct. 15, 2024

(54) METHOD FOR MANUFACTURING LIGHT EMITTING ELEMENTS AND DISPLAY DEVICE INCLUDING LIGHT EMITTING ELEMENTS

(71) Applicant: Samsung Display Co., LTD., Yongin-si (KR)

(72) Inventors: Seung A Lee, Seoul (KR); Dong Uk Kim, Hwaseong-si (KR); Hyun Min Cho, Seoul (KR); Dae Hyun Kim, Hwaseong-si (KR); Jung Hong Min, Pyeongtaek-si (KR); Dong Eon Lee, Hwaseong-si (KR); Hyung Rae Cha, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 457 days.

(21) Appl. No.: 17/276,038

(22) PCT Filed: Apr. 23, 2019

(86) PCT No.: PCT/KR2019/004870
§ 371 (c)(1),
(2) Date: Mar. 12, 2021

(87) PCT Pub. No.: WO2020/054938
PCT Pub. Date: Mar. 19, 2020

(65) Prior Publication Data
US 2022/0052106 A1     Feb. 17, 2022

(30) Foreign Application Priority Data
Sep. 13, 2018   (KR) .................. 10-2018-0109391

(51) Int. Cl.
*H01L 33/00*     (2010.01)
*H01L 27/15*     (2006.01)
(Continued)

(52) U.S. Cl.
CPC .......... *H01L 27/156* (2013.01); *H01L 33/007* (2013.01); *H01L 33/0093* (2020.05);
(Continued)

(58) Field of Classification Search
None
See application file for complete search history.

(56) References Cited

U.S. PATENT DOCUMENTS

| 5,728,215 A | 3/1998 | Itagaki et al. |
| 2005/0074393 A1 | 4/2005 | Wu et al. |

(Continued)

FOREIGN PATENT DOCUMENTS

| CN | 101009214 | 8/2007 |
| CN | 101529605 | 9/2009 |

(Continued)

OTHER PUBLICATIONS

Hung-Wen Huang et al., "Fabrication of GaN-based nanorod light emitting diodes using self-assemble nickel nano-mask and inductively coupled plasma reactive ion etching", Materials Science and Engineering B, 2004, pp. 125-129, vol. 113.

(Continued)

*Primary Examiner* — Bradley Smith
(74) *Attorney, Agent, or Firm* — KILE PARK REED & HOUTTEMAN PLLC

(57) ABSTRACT

A method of manufacturing a light-emitting element comprises providing a semiconductor structure on a substrate, the semiconductor structure emitting light having different wavelength bands from each other, measuring the light having the different wavelength bands from each other and defining wavelength regions, forming nanopatterns spaced apart from each other on the semiconductor structure, the nanopatterns having different diameters from each other, and etching the semiconductor structure to form element rods.

19 Claims, 21 Drawing Sheets

(51) Int. Cl.
  *H01L 33/24* (2010.01)
  *H01L 33/44* (2010.01)
  *H01L 33/60* (2010.01)
(52) U.S. Cl.
  CPC .......... *H01L 33/0095* (2013.01); *H01L 33/24* (2013.01); *H01L 33/44* (2013.01); *H01L 33/60* (2013.01); *H01L 2933/0025* (2013.01)

(56) References Cited

U.S. PATENT DOCUMENTS

| | | | |
|---|---|---|---|
| 2010/0026779 | A1 | 2/2010 | Yonehara et al. |
| 2013/0048945 | A1* | 2/2013 | Fang ............... H01L 33/20 438/46 |
| 2013/0193558 | A1 | 8/2013 | Ju et al. |
| 2013/0200391 | A1 | 8/2013 | Bedair et al. |
| 2013/0221323 | A1 | 8/2013 | Kuo et al. |
| 2013/0313517 | A1* | 11/2013 | Choi ............... H01L 33/08 257/13 |
| 2014/0217361 | A1* | 8/2014 | Seong ............... H01L 33/04 438/34 |
| 2017/0076986 | A1 | 3/2017 | Forrest et al. |
| 2017/0317228 | A1 | 11/2017 | Sung |
| 2017/0322451 | A1 | 11/2017 | Kang et al. |

FOREIGN PATENT DOCUMENTS

| | | |
|---|---|---|
| CN | 101863452 | 10/2010 |
| CN | 101867000 | 10/2010 |
| CN | 105009309 | 10/2015 |
| CN | 205666251 | 10/2016 |
| CN | 107634081 | 1/2018 |
| JP | 2008-34483 | 2/2008 |
| JP | 2016-146421 | 8/2016 |
| KR | 10-2009-0074091 | 7/2009 |
| KR | 10-2010-0071380 | 6/2010 |
| KR | 10-2012-0028104 | 3/2012 |
| KR | 10-2012-0058137 | 6/2012 |
| KR | 10-2014-0144227 | 12/2014 |
| KR | 10-2015-0117744 | 10/2015 |
| KR | 10-1567121 | 11/2015 |
| KR | 10-1710159 | 3/2017 |
| KR | 10-1754223 | 7/2017 |
| KR | 10-2018-0009014 | 1/2018 |
| KR | 10-2019-0121894 | 10/2019 |
| KR | 10-2019-0140545 | 12/2019 |

OTHER PUBLICATIONS

Extended European search report for European Patent Application or Patent No. 19858944.2 dated May 16, 2022.

Written Opinion, with English translation, corresponding to International Application No. PCT/KR2019/004870, dated Aug. 14, 2019.

International Search Report, with English translation, corresponding to International Application No. PCT/KR2019/004870 dated Aug. 14, 2019.

\* cited by examiner

WA: WA1, WA2, WA3

WA: WA1, WA2, WA3

WA: WA1, WA2, WA3

METHOD FOR MANUFACTURING LIGHT EMITTING ELEMENTS AND DISPLAY DEVICE INCLUDING LIGHT EMITTING ELEMENTS

CROSS-REFERENCE TO RELATED APPLICATION(S)

This application is a national entry of International Application No. PCT/KR2019/004870, filed on Apr. 23, 2019, which claims under 35 U.S.C. § 119(a) and 365(b) priority to and benefits of Korean Patent Application No. 10-2018-0109391, filed on Sep. 13, 2018 in the Korean Intellectual Property Office, the entire contents of which are incorporated herein by reference.

1. TECHNICAL FIELD

The disclosure relates to a method of manufacturing a light emitting element and a display device including the light emitting element, and to a method of manufacturing a light emitting element in which a deviation of an emission wavelength formed according to a difference in the composition of a fluorescent material may be compensated, and display device including the light emitting element.

2. DESCRIPTION OF THE RELATED ART

The importance of a display device has increased with the development of multimedia. Accordingly, various types of display devices such as an organic light emitting display (OLED) and a liquid crystal display (LCD) have been implemented.

A display device is a device for displaying an image, and may include a display panel such as a light emitting display panel or a liquid crystal display panel. Among them, the light emitting display panel may include light emitting elements such as light emitting diodes (LEDS). Light emitting diodes (LEDs) may include an organic light emitting diode (OLED) using an organic material as a fluorescent material and an inorganic light emitting diode using an inorganic material as a fluorescent material.

An organic light emitting diode (OLED) has an advantage of a simple manufacturing process and flexible characteristics because it uses an organic material as a fluorescent material. However, it the organic material may be vulnerable to high-temperature driving environments and has a relatively low efficiency of blue light.

On the other hand, an inorganic light emitting diode has an advantage of durability even in high-temperature environments and has higher efficiency of blue light than an organic light emitting diode because it uses an inorganic semiconductor as a fluorescent material. Further, even in spite of manufacturing process difficulties of a conventional inorganic light emitting diode, transcription methods using dielectrophoresis (DEP) have been developed. Therefore, research is being continued on inorganic light emitting diodes having higher durability and efficiency than organic light emitting diodes.

An inorganic light emitting diode may be manufactured by growing a semiconductor layer doped with an n-type dopant or a p-type dopant and an inorganic fluorescent material layer on a substrate, forming rods each having a specific shape, and then separating the rods. However, in a case that the inorganic fluorescent material layer is grown on a substrate, for example, a wafer substrate, a difference in the composition of a fluorescent material may occur according to a spatial position on the wafer substrate. Accordingly, there may be a problem in that a variation in emission wavelength may occur between the rods grown on the wafer substrate.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects to be achieved by the disclosure are to provide a method of manufacturing a light emitting element in which a deviation in emission wavelength of non-uniformly formed rods may be reduced by controlling the diameter of the rods grown on a wafer substrate when manufacturing the light emitting element and to provide a display device including the light emitting element.

Additional advantages, subjects, and features of the disclosure will be set forth in part in the description which follows and in part will become apparent to those having ordinary skill in the art upon examination of the following or may be learned from practice of the disclosure.

According to an embodiment, a method of manufacturing a light emitting element may comprise providing a semiconductor structure on a substrate, the semiconductor structure emitting light having different wavelength bands from each other; measuring the light having the different wavelength bands from each other and defining wavelength regions; forming nanopatterns spaced apart from each other on the semiconductor structure, the nanopatterns having different diameters from each other; and etching the semiconductor structure to form element rods.

The wavelength regions may include a first wavelength region emitting a first light having a first wavelength band; a second wavelength region emitting a second light having a second wavelength band shorter than the first wavelength band; and a third wavelength region emitting a third light having a third wavelength band shorter than the second wavelength band.

The forming of the nanopatterns may include forming a nanopattern having a large diameter on a wavelength region as a wavelength band of light emitted from the wavelength region decreases.

The nanopatterns may include a first nanopattern, a second nanopattern having a larger diameter than a diameter of the first nanopattern; and a third nanopattern having a larger diameter than a diameter of the second nanopattern; and the forming of the nanopatterns may include forming the first nanopattern on the first wavelength region; forming the second nanopattern on the second wavelength region; and forming the third nanopattern on the third wavelength region.

The forming of the element rods may include forming a first element rod in a region overlapping the first wavelength region; forming a second element rod in a region overlapping the second wavelength region; and forming a third element rod in a region overlapping the third wavelength region.

The second element rod may have a diameter larger than a diameter of the first element rod and smaller than a diameter of the third element rod, and the first element rod, the second element rod, and the third element rod may emit light of substantially same wavelength band.

The third wavelength region may be disposed at a center of the semiconductor structure, the second wavelength region may surround an outer surface of the third wavelength region, and the first wavelength region may surround an outer surface of the second wavelength region.

The semiconductor structure may include a first axis traversing the center of the semiconductor structure, a diameter of a nanopattern may increase from an end of the first axis toward the center of the semiconductor structure, and a diameter of a nanopattern may decrease from the center of the semiconductor structure toward another end of the first axis traversing the center of the semiconductor structure.

The semiconductor structure may include a second axis traversing the center of the semiconductor structure, the first wavelength region may be disposed at an end of the second axis, the second wavelength region may partially surround an outer surface of the first wavelength region and may extend in a direction of another end of the second axis, and the third wavelength region may partially surround an outer surface of the second wavelength region and may extend to the another end of the second axis of the semiconductor structure.

A diameter of at least one nanopattern disposed along the second axis may increase from the end of the second axis toward the another end of the second axis.

According to an embodiment, a method of manufacturing a light emitting element may comprise providing a semiconductor structure disposed on a substrate and including a first conductive semiconductor layer, an active material layer, and a second conductive semiconductor layer; forming an etching mask layer on the semiconductor structure and one or more etching pattern layers of different diameters and spaced apart from each other on the etching mask layer; etching the semiconductor structure in a direction perpendicular to the substrate along a region where nanopatterns may be spaced apart from each other to form element rods; and separating the element rods from the substrate to form light emitting elements.

The nanopatterns may include a first nanopattern; a second nanopattern having a larger diameter than a diameter of the first nanopattern; and a third nanopattern having a larger diameter than the diameter of the second nanopattern.

The light emitting elements may include a first light emitting element having a diameter equal to the diameter of the first nanopattern; a second light emitting element having a diameter equal to the diameter of the second nanopattern; and a third light emitting element having a diameter equal to the diameter of the third nanopattern.

A difference in diameter between the first light emitting element and the second light emitting element may be in a range of about 2% to about 16% of the diameter of the second light emitting element.

An interval between one or more nanopatterns spaced apart from each other may be in a range of about 2.5 times to about 3.5 times the diameter of each of the nanopatterns.

The nanopattern may have a circular shape or a polygonal shape.

The method may further include forming a separation layer between the first substrate and the first conductive semiconductor layer, wherein the forming of the light emitting elements may include removing the separation layer to separate the element rods from the substrate.

According to an embodiment, a display device may comprise at least one first electrode and at least one second electrode disposed on a substrate, the least one first electrode and at least one second electrode extending in a first direction and spaced apart from each other in a second direction different from the first direction; at least one light emitting element disposed in a space between the at least one first electrode and the at least one second electrode; a first contact electrode partially overlapping the at least one first electrode and electrically contacting a first end of the at least one light emitting element; and a second contact electrode partially overlapping the at least one second electrode and electrically contacting a second end of the at least one light emitting element, the second end of the at least one light emitting element being opposite to the first end of the at least one light emitting element, wherein the at least one light emitting element may include a first light emitting element and a second light emitting element having a larger diameter than a diameter of the first light emitting element, and the first light emitting element and the second light emitting element may emit light of substantially same wavelength band.

A difference in diameter between the first light emitting element and the second light emitting element may be in a range of about 2% to about 16% of the diameter of the second light emitting element.

The at least one light emitting element may include a third light emitting element, and the third light emitting element may have a larger diameter than the diameter of the second light emitting element and may emit light of substantially same wavelength band as the second light emitting element.

The above and other features and advantages of the disclosure will become more apparent by describing in detail embodiments thereof with reference to the attached drawings.

According to the method of manufacturing a light emitting element according to an embodiment, nanopatterns formed on a semiconductor structure have different diameters, so that the wavelength band of light emitted from element rods may be shifted. Accordingly, the plurality of light emitting elements may have different diameters, but may emit light of substantially the same wavelength band.

Further, it may be possible to provide a display device including the above-described light emitting element and minimizing a deviation in emission wavelengths emitted from each pixel.

The effects of the disclosure are not limited to the above-described effects, and other unmentioned effects will be clearly understood to those skilled in the art from the description of claims.

BRIEF DESCRIPTION OF THE DRAWINGS

The above and other features of the disclosure will become more apparent by describing in further detail embodiments thereof with reference to the accompanying drawings, in which.

DETAILED DESCRIPTION OF THE EMBODIMENTS

Figure 1:
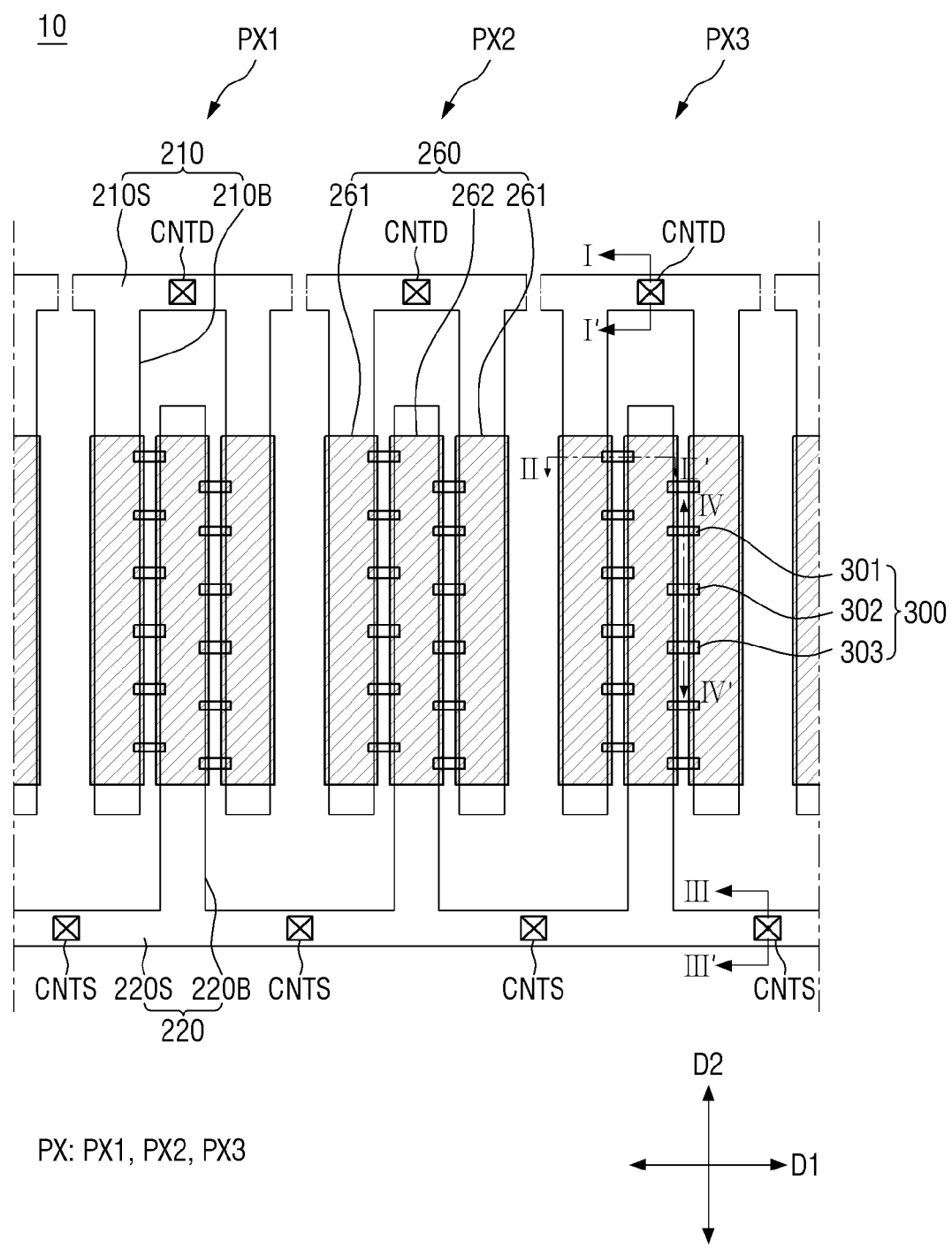
FIG. 1 is a plan view of a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

Furthermore, the sizes, ratios, etc. of elements in the drawings may be slightly exaggerated for clarity. It should be noted that the same reference numerals are used to designate the same or similar elements throughout the drawings, and repetitive explanation may be omitted.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

It will be further understood that the terms "comprise", "include", "have", and their variations when used in this specification, specify the presence of stated features, integers, steps, operations, elements, components, and/or combinations of them but do not preclude the presence or addition of one or more other features, integers, steps, operations, elements, components, and/or combinations thereof.

In the disclosure, it will be understood that when an element or layer is referred to as being "on", "connected to" or "coupled to" another element or layer, it may be directly on, connected or coupled to the other element or layer or intervening elements or layers may be present.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the disclosure will be described in detail with reference to the accompanying drawings.

FIG. 1 is a plan view of a display device according to an embodiment.

A display device 10 may include at least one region formed as a pixel PX. A plurality of pixels PX may be arranged or disposed in a display unit of the display device 10 to emit light of a specific or predetermined wavelength band to the outside of the display device 10. The plurality of pixels PX may include at least three pixels PX1, PX2, and PX3. Although FIG. 1 illustrates three pixels PX1, PX2, and PX3, it may be appreciated that the display device 10 may include a larger number of pixels. Although the drawings show a plurality of pixels PX arranged or disposed only in one direction, for example, in a first direction D1, the plurality of pixels PX may be arranged or disposed in a second direction D2 intersecting the first direction D1. Further, the pixels PX shown in FIG. 1 may be divided into a plurality of pixels to allow each of the plurality of pixels to constitute one pixel PX. The pixels may be arranged or disposed in a vertical direction (or second direction D2) or may be arranged in a zigzag form, instead of being arranged or disposed only in the first direction D1 in parallel as shown in FIG. 1.

Although not shown in the drawings, the display device 10 may include a light emitting area where light emitting elements 300 may be arranged or disposed to emit light of a specific or predetermined color, and a non-light emitting area formed as an area other than the light emitting area. The non-light emitting area may be covered or overlapped by specific or predetermined members not to be viewed from the outside. The non-light emitting area may be provided with various members for driving the light emitting elements 300 arranged or disposed in the light emitting area. For example, the non-light emitting area may be provided with a wiring for applying an electrical signal to the light emitting area, a circuit unit, a driving unit, and the like within the spirit and the scope of the disclosure. However, the disclosure is not limited thereto.

Each of the plurality of pixels may include at least one light emitting element 300 emitting light of a specific or predetermined wavelength band to display a color. The light emitted from the light emitting element 300 may be viewed from the outside of the display device 10. In an embodiment, light emitting elements 300 emitting light of different colors from each other may be provided for each of the pixels PX expressing different colors from each other. For example, the first pixel PX1 expressing a red color may include a light emitting element 300 emitting red light, the second pixel PX2 expressing a green color may include a light emitting element 300 emitting green light, and the third pixel PX3 expressing a blue color may include a light emitting element 300 emitting blue light. However, the disclosure is not limited thereto, and in some cases, pixels PX expressing different colors from each other may include light emitting elements 300 emitting light of the same color (for example, blue), and the colors of the respective pixels PX may be expressed by providing a wavelength conversion layer or a color filter on a light emitting path. However, the disclosure is not limited thereto, and in some cases, adjacent pixels PX may emit light of the same color.

Referring to FIG. 1, the display device 10 may include a plurality of electrodes 210 and 220 and a plurality of light emitting elements 300. At least a part of the each of the electrodes 210 and 220 may be disposed in each pixel PX, electrically connected to the light emitting elements 300, and apply electrical signals to the light emitting elements 300 to allow the light emitting elements 300 to emit light of a specific or predetermined color.

Further, at least a part of the each of the electrodes 210 and 220 may be used to form an electric field in the pixel PX in order to align the light emitting elements 300. By way of example, in a case that aligning the light emitting elements 300 emitting light of different colors from each other in the plurality of pixels PX, it is required to accurately align the light emitting elements 300 for each pixel PX. In a case that aligning the light emitting elements 300 using dielectrophoresis, a solution containing the light emitting elements 300 may be applied onto the display device 10, an AC power may be applied to the solution to form a capacitance caused by an electric field, and thus the light emitting elements 300 may be aligned by a dielectrophoretic force.

The plurality of electrodes 210 and 220 may include a first electrode 210 and a second electrode 220. In an embodiment, the first electrode 210 may be a pixel electrode separated for each pixel PX, and the second electrode 220 may be a common electrode electrically connected in common along the plurality of pixels PX. Any one of the first electrode 210 and the second electrode 220 may be an anode electrode of the light emitting element 300, and the other thereof may be a cathode electrode of the light emitting element 300. However, the disclosure is not limited to this case, and may have an opposite case.

The first electrode 210 and the second electrode 220 may include electrode stem portion 210S and 220S extending in a first direction D1 and electrode branch portions 210B and 220B extending in a second direction D2 intersecting the first direction D1 and branched from the electrode stem portions 210S and 220S, respectively.

By way of example, the first electrode 210 may include a first electrode stem portion 210S extending in the first direction D1 and at least one first electrode branch portion 210B branched from the first electrode stem portion 210S and extending in the second direction D2. Although not shown in the drawings, one or an end of the first electrode stem portion 210S may be electrically connected to a signal application pad, and the other or another end thereof may extend in the first direction D1 but electrically separated between the pixels PX. The signal application pad may be electrically connected to the display device or an external power source to apply an electrical signal to the first electrode stem portion 210S or apply an AC power thereto at the time of aligning the light emitting elements 300.

The first electrode stem portion 210S of any one pixel is placed on substantially the same line as the first electrode stem portion 210S of a neighboring pixel belonging to the same row (for example, adjacent in the first direction D1. In other words, the first electrode stem portion 210S of one pixel is terminated with both ends thereof being spaced apart from each other between the pixels PX, whereas the first electrode stem portion 210S of the neighboring pixel may be aligned with the extension line of the first electrode stem portion 210S of the one pixel. Such an arrangement of the first electrode stem portions 210S may be performed by forming one stem electrode during a manufacturing process, performing a process of aligning the light emitting elements 300, and then disconnecting the stem electrode using a laser. Accordingly, the first electrode stem portion 210S disposed in each pixel PX may apply different electrical signals from each other to the respective pixels PX, and the respective pixels PX may be driven separately from each other.

The first electrode branch portion 210B may be branched from at least a part of the first electrode stem portion 210S and extended in the second direction D2, but may be terminated with being spaced apart from the second electrode stem portion 220S disposed to face the first electrode stem portion 210S. For example, one or an end of the first electrode branch portion 210B may be electrically connected to the first electrode stem portion 210S, and the other or another end thereof may be disposed in the pixel PX with being spaced apart from the second electrode stem portion 220S. Since the first electrode branch portion 210B may be electrically connected to the first electrode branch portion 210B electrically separated for each pixel PX, the first electrode branch portion 210B may receive different electrical signals from each other for each pixel PX.

Further, one or more first electrode branch portions 210B may be disposed for each pixel PX. Although it is shown in FIG. 1 that two first electrode branch portions 210B may be disposed and the second electrode branch portion 220B may be disposed therebetween, the disclosure is not limited thereto, and a larger number of first electrode branch portions 210B may be disposed. In this case, the first electrode branch portions 210B may be alternately spaced apart from the plurality of second electrode branch portions 220B, and a plurality of light emitting elements 300 may be disposed therebetween. In an embodiment, the second electrode branch portion 220B may be disposed between the first electrode branch portions 210B, so that each pixel PX may have a substantially symmetrical structure with respect to the second electrode branch portion 220B. However, the disclosure is not limited thereto.

The second electrode 220 may include a second electrode stem portion 220S extending in the first direction D1, spaced apart from the first electrode stem portion 210S and facing the first electrode stem portion 210S and at least one second electrode branch portion 220B branched from the second electrode stem portion 220S, extending in the second direction D2, spaced apart from the first electrode branch portion 210B and facing the first electrode branch portion 210B. Like the first electrode stem portion 210S, one or an end of the second electrode stem portion 220S may also be electrically connected to a signal application pad. However, the other end of the second electrode stem portion 220S may extend to the plurality of pixels PX adjacent in the first direction D1. For example, the second electrode stem portion 220S may be electrically connected between the pixels PX. Accordingly, both ends of the second electrode stem portion 220S of any one pixel may be electrically connected to one or an end of the second electrode stem portion 220S of a neighboring pixel PX between the respective pixels PX, so that the same electrical signal may be applied to the respective pixels PX.

The second electrode branch portion 220B may be branched from at least a part of the second electrode stem portion 220S and extended in the second direction D2, but may be terminated with being spaced apart from the first electrode stem portion 210S. For example, one or an end of the second electrode branch portion 220B may be electrically connected to the second electrode stem portion 220S, and the other or another end thereof may be disposed in the pixel PX with being spaced apart from the first electrode stem portion 210S. Since the second electrode branch portion 220B may be electrically connected to the second electrode branch portion 220B electrically connected for each pixel PX, the second electrode branch portion 220B may receive the same electrical signal for each pixel PX.

Further, the second electrode branch portion 220B may be disposed to be spaced apart from the first electrode branch portion 210B and face the first electrode branch portion 210B. Here, since the first electrode stem portion 210S and the second electrode stem portion 220S may be spaced apart from each other and face each other in directions opposite to each other with respect to the center of each pixel PX, the first electrode branch portion 210B and the second electrode branch portion 220B may extend in directions opposite to each other. In other words, the first electrode branch portion 210B extends in one direction of the second direction D2, and the second electrode branch portion 220B extends in the other direction of the second direction D2, so that ends of the respective branch portions may be disposed in directions opposite to each other with respect to the center of the pixel PX. However, the disclosure is not limited thereto, and the first electrode stem portion 210S and the second electrode stem portion 220S may be disposed to be spaced apart from each other in the same direction with respect to the center of the pixel PX. In this case, the first electrode branch portion 210B and the second electrode branch portion 220B, respectively branched from the first electrode stem portion 210S and the second electrode stem portion 220S, may extend in the same direction.

Although it is shown in FIG. 1 that one second electrode branch portion 220B may be disposed in each pixel PX, the disclosure is not limited thereto, and a larger number of second electrode branch portions 220B may be disposed.

A plurality of light emitting elements 300 may be arranged or disposed between the first electrode branch portion 210B and the second electrode branch portion 220B. One ends of at least some or a predetermined number of the plurality of light emitting elements 300 may be electrically connected to the first electrode branch portion 210B, and the other ends thereof may be electrically connected to the second electrode branch portion 220B.

The plurality of light emitting elements 300 may be spaced from each other in the second direction D2 and may be aligned substantially parallel to each other. The interval between the light emitting elements 300 is not particularly limited. In some cases, the plurality of light emitting elements 300 may be arranged or disposed adjacent to each other to form a group, the plurality of light emitting elements 300 may form a group in a state spaced apart at a predetermined interval, and the plurality of light emitting elements 300 may have non-uniform density and may be oriented and aligned in one direction.

Meanwhile, the plurality of light emitting elements 300 may include light emitting elements 300 having different diameters from each other, for example, a first light emitting element 301, a second light emitting element 302, and a third light emitting element 303.

As will be described later, the light emitting element 300 may emit light of different wavelength bands according to the composition of an element active layer 330 and the kind of an active material. In a case that manufacturing the light emitting element 300, the element active layer 330 grown on the same wafer substrate may have a difference in composition according to a spatial position, and may have a deviation in a wavelength band of partially emitted light.

For example, in a case that the second light emitting element 302 having an arbitrary diameter emits second light L2 having a second wavelength band, other light emitting elements 300 grown on the same wafer substrate may have a difference in composition of the element active layer 330 according to the spatial position of the wafer substrate. Accordingly, in a case that another light emitting element has the same diameter as the second light emitting element 302, light of a different wavelength band, for example, first light of a first wavelength band longer than a second wavelength band or third light L3 of a third wavelength band shorter than the second wavelength band may be emitted according to a difference in the composition of the element active layer 330. In other words, in a case that the light emitting elements 300 grown on the same wafer substrate have the same diameter, deviations in emission wavelengths may occur due to a difference in the composition of the element active layer 330.

In order to minimize the deviation in emission wavelength between the light emitting elements 300, in the method of manufacturing the light emitting element 300 according to an embodiment, etching pattern layers 1700 (shown in FIG. 8) having different diameters may be formed, thereby forming element rods ROD (shown in FIG. 12) having different diameters from each other according to the difference in composition of the element active layer 330, and the display device 10 according to an embodiment may include light emitting elements 300 having different diameters from each other and emitting light of substantially the same wavelength band. Details thereof will be described later.

Contact electrodes 260 may be disposed on the first electrode branch portion 210B and the second electrode branch portion 220B, respectively.

The plurality of contact electrodes 260 may be arranged or disposed to be extended in the second direction D2 and spaced apart from each other in the first direction D1. Each of the contact electrodes 260 may be in contact with at least one end of the light emitting element 300, and may be in contact with the first electrode 210 or the second electrode 220 to receive an electrical signal. Thus, the contact electrode 260 may transmit the electrical signal received from the first electrode 210 or the second electrode 220 to the light emitting element 300.

The contact electrodes 260 may be disposed on the electrode branch portions 210B and 220B to partially cover or overlap the electrode branch portions 210B and 220B, and may include a first contact electrode 261 and a second contact electrode 262, each contacting one end or the other end of the light emitting element 300.

The first contact electrode 261 may be disposed on the first electrode branch portion 210B, and may be in contact with one end of the light emitting element 300 electrically connected to the first electrode 210. The second contact electrode 262 may be disposed on the second electrode branch portion 220B, and may be in contact with the other end of the light emitting element 300 electrically connected to the second electrode 220.

In an embodiment, both ends of the light emitting element 300 electrically connected to the first electrode branch portion 210B or the second electrode branch portion 220B may be a conductive semiconductor layer doped with an n-type dopant or a p-type dopant. In a case that one or an end of the light emitting element 300 electrically connected to the first electrode branch portion 210B may be a conductive semiconductor layer doped with a p-type dopant, the other or another end of the light emitting element 300 electrically connected to the second electrode branch portion 220B may be a conductive semiconductor layer doped with an n-type dopant. However, the disclosure is not limited thereto.

The first contact electrode 261 and the second contact electrode 262 may be disposed on the first electrode branch 210B and the second electrode branch 220B to partially cover or overlap the first electrode branch 210B and the second electrode branch 220B, respectively. As shown in FIG. 1, the first contact electrode 261 and the second contact electrode 262 may be disposed to be extended in the second direction D2, spaced apart from each other and face each other. However, one end of each of the first contact electrode 261 and the second contact electrode 262 may be terminated to partially expose one end of each of the electrode branch portions 210B and 220B. Further, the other end of each of the first contact electrode 261 and the second contact electrode 262 may be terminated in a state where they may be spaced apart from each other so as not to overlap each of the electrode stem portions 210S and 220S. However, the disclosure is not limited thereto, and the other end of each of the first contact electrode 261 and the second contact electrode 262 may cover or overlap each of the electrode branch portions 210B and 220B.

Meanwhile, as shown in FIG. 1, the first electrode stem portion 210S and the second electrode stem portion 220S may be electrically connected to a thin film transistor 120 or a power supply wiring 161, which will be described later, through contact holes, for example, a first electrode contact hole CNTD and a second electrode contact hole CNTS, respectively. Although it is shown in FIG. 1 that the contact holes on the first electrode stem portion 210S and the second electrode stem portion 220S may be arranged or disposed for each pixel PX, the disclosure is not limited thereto. As described above, since the second electrode stem portion 220S may extend to be electrically connected to the adjacent pixel PX, in an embodiment, the second electrode stem portion 220S may be electrically connected to a thin film transistor through one contact hole.

Hereinafter, more structures of a plurality of members disposed on the display device 10 will be described with reference to FIG. 2.

Figure 2:
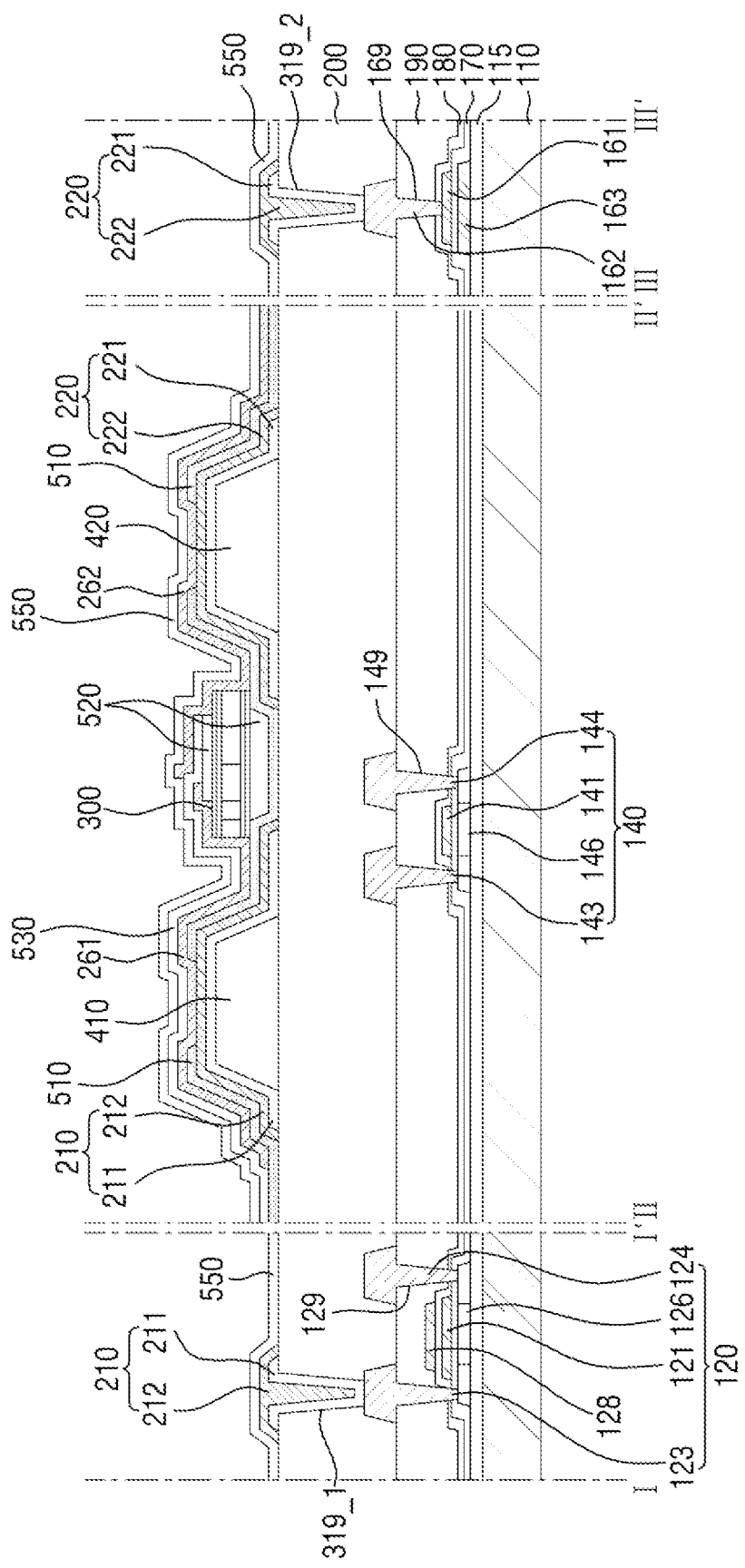
FIG. 2 is a schematic cross-sectional view taken along the lines I-I', and of FIG. 1.

FIG. 2 is a schematic cross-sectional view taken along the lines I-I', and of FIG. 1. Although FIG. 2 shows only one pixel PX, it may be applied to other pixels as well. FIG. 2 shows a cross-section across one or an end and the other or another end of any light emitting element 300.

Referring to FIGS. 1 and 2, the display device 10 may include a substrate 110, thin film transistors 120 and 140 disposed on the substrate 110, and electrodes 210 and 220 and a light emitting element 300 disposed over the thin film transistors 120 and 140. The thin film transistors may include a first thin film transistor 120 and a second thin film transistor 140, which may be a driving transistor and a switching transistor, respectively. Each of the thin film transistors 120 and 140 may include an active layer, a gate electrode, a source electrode, and a drain electrode. The first electrode 210 may be electrically connected to the drain electrode of the first thin film transistor 120.

As an example, the substrate 110 may be an insulating substrate. The substrate 110 may be made of an insulating material such as glass, quartz, or a polymer resin. Examples of the polymer resin may include polyethersulphone (PES), polyacrylate (PA), polyarylate (PAR), polyetherimide (PEI), polyethylene napthalate (PEN), polyethylene tereptalate (PET), polyphenylene sulfide (PPS), polyallylate, polyimide (PI), polycarbonate (PC), cellulose triacetate (CAT), cellulose acetate propionate (CAP), and combinations thereof. The substrate 110 may be a rigid substrate, but may be a flexible substrate capable of bending, folding, rolling, or the like within the spirit and the scope of the disclosure.

A buffer layer 115 may be disposed on the substrate 110. The buffer layer 115 may prevent the diffusion of impurity ions, may prevent the penetration of moisture or external air, and may perform a surface planarization function. The buffer layer 115 may include silicon nitride, silicon oxide, or silicon oxynitride.

A semiconductor layer is disposed on the buffer layer 115. The semiconductor layer may include a first active layer 126 of the first thin film transistor 120, a second active layer 146 of the second thin film transistor 140, and an auxiliary layer 163. The semiconductor layer may include polycrystalline silicon, monocrystalline silicon, an oxide semiconductor, or the like within the spirit and the scope of the disclosure.

A first gate insulating layer 170 is disposed on the semiconductor layer. The first gate insulating layer 170 may cover or overlap the semiconductor layer. The first gate insulating layer 170 may function as a gate insulating film of the thin film transistor. The first gate insulating layer 170 may include silicon oxide, silicon nitride, silicon oxynitride, aluminum oxide, tantalum oxide, hafnium oxide, zirconium oxide, titanium oxide, or the like within the spirit and the scope of the disclosure. These compounds may be used alone or in combination with each other.

A first conductive layer is disposed on the first gate insulating layer 170. The first conductive layer may include a first gate electrode 121 disposed on the first active layer 126 of the first thin film transistor 120, a second gate electrode 141 disposed on the second active layer 146 of the second thin film transistor 140, and a power supply wiring 161 disposed on the auxiliary layer 163, with the first gate insulating layer 170 therebetween. The first conductive layer may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The first conductive layer may be a single-layer film or a multilayer film.

A second gate insulating layer 180 is disposed on the first conductive layer. The second gate insulating layer 180 may be an interlayer insulating film. The second gate insulating layer 180 may include an inorganic insulating material such as silicon oxide, silicon nitride, silicon oxynitride, hafnium oxide, aluminum oxide, titanium oxide, tantalum oxide, or zinc oxide.

A second conductive layer is disposed on the second gate insulating layer 180. The second conductive layer may include a capacitor electrode 128 disposed on the first gate electrode 121 with the second gate insulating layer 180 therebetween. The capacitor electrode 128 may constitute a storage capacitor together with the first gate electrode 121.

Like the first conductive layer, the second conductive layer may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

An interlayer insulating layer 190 is disposed on the second conductive layer. The interlayer insulating layer 190 may be an interlayer insulating film. Moreover, the interlayer insulating layer 190 may perform a surface planarization function. The interlayer insulating layer 190 may include an organic insulating material such as polyacrylate resin, epoxy resin, phenolic resin, polyamide resin, polyimide rein, unsaturated polyester resin, polyphenyleneether resin, polyphenylenesulfide resin, or benzocyclobutene (BCB).

A third conductive layer is disposed on the interlayer insulating layer 190. The third conductive layer may include a first drain electrode 123 and first source electrode 124 of the first thin film transistor 120, a second drain electrode 143 and second source electrode 144 of the second thin film transistor 140, and a power supply electrode 162 disposed on the power supply wiring 161.

Each of the first source electrode 124 and the first drain electrode 123 may be electrically connected to the first active layer 126 through a first contact hole 129 penetrating the interlayer insulating layer 190 and the second gate insulating layer 180. Each of the second source electrode 144 and the second drain electrode 143 may be electrically connected to the second active layer 146 through a second contact hole 149 penetrating the interlayer insulating layer 190 and the second gate insulating layer 180. The power supply electrode 162 may be electrically connected to the power supply wiring 161 through a third contact hole 169 penetrating the interlayer insulating layer 190 and the second gate insulating layer 180.

The third conductive layer may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The third conductive layer may be a single-layer film or a multilayer film. For example, the third conductive layer may be formed of a laminate structure of Ti/Al/Ti, Mo/Al/Mo, Mo/AlGe/Mo, or Ti/Cu.

An insulating substrate layer 300 is disposed on the third conductive layer. The insulating substrate layer 300 may include an organic insulating material such as polyacrylate resin, epoxy resin, phenolic resin, polyamide resin, polyimide rein, unsaturated polyester resin, polyphenyleneether resin, polyphenylenesulfide resin, or benzocyclobutene (BCB). The surface of the insulating substrate layer 300 may be flat.

A plurality of banks 410 and 420 may be disposed on the insulating substrate layer 300. The plurality of banks 410 and 420 may be disposed to be space apart from each other and face each other in each of the pixels PX, and the first electrode 210 and the second electrode 220 may be disposed on the banks 410 and 420 spaced apart from each other, for example, a first bank 410 and a second bank 420. FIG. 2 shows a case where three banks 410 and 420, for example, two first banks 410 and one second bank 420 may be disposed in one pixel PX, and thus two first electrodes 210 and one second electrode 220 may be disposed. FIG. 2 shows only a schematic cross-sectional view of one first bank 410 and one second bank 420, and the arrangement structure thereof may be equally applied to other first banks 410 not shown in FIG. 2.

However, the number of banks 410 and 420 is not limited thereto. For example, a larger number of banks 410 and 420 may be disposed in one pixel PX, and thus a larger number of first and second electrodes 210 and 220 may be disposed. The banks 410 and 420 may include at least one first bank 410 on which the first electrode 210 is disposed, and at least one second bank 420 on which the second electrode 220 is disposed. In this case, the first bank 410 and the second bank 420 may be disposed to be spaced apart from each other and face each other, and the plurality of banks may be alternately arranged or disposed in one direction. In an embodiment, two first banks 410 may be disposed to be spaced apart from each other, and one second bank 420 may be disposed between the spaced first banks 410.

Further, although not shown in FIG. 2, as described above, the first electrode 210 and the second electrode 220 may include the electrode stem portions 210S and 220S and the electrode branch portions 210B and 220B, respectively. It may be understood that the first electrode branch portion 210B and the second electrode branch portion 220B may be disposed on the first bank 410 and the second bank 420, respectively.

The plurality of banks 410 and 420 may be made of substantially the same or similar material, and thus may be formed in one process. In this case, the banks 410 and 420 may form one lattice pattern. The banks 410 and 420 may include polyimide (PI).

Meanwhile, although not shown in the drawings, at least some or a predetermined number of the plurality of banks 410 and 420 may be disposed at the boundary between the respective pixels PX to distinguish them from each other. In this case, the electrodes 210 and 220 may not be disposed on the banks 410 and 420 disposed at the boundary between the respective pixels PX. These banks may be arranged or disposed in a substantially lattice pattern together with the first bank 410 and second bank 420 described above. At least some or a predetermined number of the plurality of banks 410 and 420 disposed at the boundary between the respective pixels PX may be disposed to cover or overlap the electrode lines of the display panel 10.

Each of the plurality of banks 410 and 420 may have a structure in which at least a part thereof protrudes from the insulating substrate layer 200. Each of the banks 410 and 420 may protrude upward with respect to a plane on which the light emitting element 300 is disposed, and at least a part of the protruding portion may have an inclination. Each of the banks 410 and 420 protruding with an inclination may reflect light incident on reflective layers 211 and 221 disposed thereon, which will be described later. Light directed from the light emitting element 300 to the reflective layers 211 and 221 may be reflected and transmitted to the outside of the display device 10, for example, above the banks 410 and 420. The shape of each of the protruded banks 410 and 420 is not particularly limited. Although it is shown in FIG. 2 that each of the banks 410 and 420 may have a protruding structure having a substantially angled corner shape in which both side surfaces may be flat and one or an upper side may be flat, the disclosure is not limited thereto, and each of the banks 410 and 420 may have a structure protruding in a substantially curved shape.

The reflective layers 211 and 221 may be disposed on the plurality of banks 410 and 420.

The first reflective layer 211 may cover or overlap the first bank 410, and a part thereof may be electrically connected to the first drain electrode 123 of the first thin film transistor 120 through a fourth contact hole 319_1 penetrating the insulating substrate layer 200. The second reflective layer 221 may cover or overlap the second bank 420, and a part thereof may be electrically connected to the power supply electrode 162 through a fifth contact hole 319_2 penetrating the insulating substrate layer 200.

The first reflective layer 211 may be electrically connected to the first drain electrode 123 of the first thin film transistor 120 through the fourth contact hole 319_1 in the pixel PX. Therefore, the first thin film transistor 120 may be disposed in a region overlapping the pixel PX. It is shown in FIG. 1 that the first reflective layer 211 is electrically connected to the first thin film transistor 120 through the first electrode contact hole CNTD disposed on the first electrode stem portion 210S. For example, the first electrode contact hole CNTD may be the fourth contact hole 319_1.

The second reflective layer 221 may also be electrically connected to the power supply electrode 162 through the fifth contact hole 319_2 in the pixel PX. It is shown in FIG. 2 that the second reflective layer 221 is electrically connected to the power supply electrode 162 through the fifth contact hole 319_2 in one pixel PX. It is shown in FIG. 1 that the second electrode 220 of each pixel PX may be electrically connected to the power supply wiring 161 through the plurality of second electrode contact holes CNTS on the second electrode stem portion 220S. For example, the second electrode contact hole CNTD may be the fifth contact hole 319_2.

As described above, in FIG. 1, the first electrode contact hole CNTD and the second electrode contact hole CNTS may be disposed on the first electrode stem portion 210S and the second electrode stem portion 220S, respectively. Accordingly, it is shown in FIG. 2 that, in the schematic cross-sectional view of the display device 10, the first electrode 210 and the second electrode 220 may be electrically connected to the first thin film transistor 120 or the power supply wiring 161 through the fourth contact hole 319_1 and the fifth contact hole 319_2, respectively, in a region spaced apart from the banks 410 and 420 where the first electrode branch portion 210B and the second electrode branch portion 220B may be disposed.

However, the disclosure is not limited thereto. For example, in FIG. 1, the second electrode contact hole CNTS may be disposed at various positions even on the second electrode stem portion 220S, and in some cases, the second electrode contact hole CNTS may be disposed on the second electrode branch portion 220B. Further, in an embodiment, the second reflective layer 221 may be electrically connected to one second electrode contact hole CNTS or one fifth contact hole 319_2 in a region other than the pixel PX.

The display device 10 may include an area other than the light-emitting area where the light emitting elements 300 may be disposed, for example, a non-light emitting area where the light emitting elements 300 may not be disposed. As described above, the second electrodes 220 of each pixel PX may be electrically connected to each other through the second electrode stem portion 220S, so as to receive the same electrical signal.

In an embodiment, in the case of the second electrode 220, the second electrode stem portion 220S may be electrically connected to the power supply electrode 162 through one second electrode contact hole CNTS in the non-light emitting area located or disposed at the outside of the display device 10. Different from the display device 10 of FIG. 1, even in a case that the second electrode stem portion 220S may be electrically connected to the power supply electrode 162 through one contact hole, the second electrode stem portion 220S is extended to the adjacent pixel PX and may be electrically connected, so that the same electric signal may be applied to the second electrode branch portion 220B of each pixel PX. In the case of the second electrode 220 of the display device 10, the position of the contact hole for receiving an electric signal from the power supply electrode 162 may vary according to the structure of the display device 10.

Meanwhile, referring to FIGS. 1 and 2 again, each of the reflective layers 211 and 221 may include a high-reflectance material to reflect the light emitted from the light emitting element 300. For example, each of the reflective layers 211 and 221 may include a material such as silver (Ag) or copper (Cu), but the disclosure is not limited thereto.

A first electrode layer 212 and a second electrode layer 222 may be disposed on the first reflective layer 211 and the second reflective layer 221, respectively.

The first electrode layer 212 is disposed directly on the first reflective layer 211. The first electrode layer 212 may have substantially the same pattern as the first reflective layer 211. The second electrode layer 222 is disposed directly on the second reflective layer 221 and spaced apart from the first electrode layer 212. The second electrode layer 222 may have substantially the same pattern as the second reflective layer 221.

In an embodiment, the electrode layers 212 and 222 may cover or overlap the underlying reflective layers 211 and 221, respectively. For example, the electrode layers 212 and 222 may be formed to be larger than the reflective layers 211 and 221 to cover or overlap the side surfaces of ends of the electrode layers 212 and 222. However, the disclosure is not limited thereto.

The first electrode layer 212 and the second electrode layer 222 may transmit the electric signals transmitted to the first reflective layer 211 and second reflective layer 221 electrically connected to the first thin film transistor 120 or the power supply electrode 162 to electrically contact electrodes to be described later. The electrode layers 212 and 222 may include a transparent conductive material. For example, the electrode layers 212 and 222 may include a material such as indium tin oxide (ITO), indium zinc oxide (IZO), or indium tin-zinc oxide (ITZO), but the disclosure is not limited thereto. In an embodiment, the reflective layers 211 and 221 and the electrode layers 212 and 222 may have a structure in which a transparent conductive layer such as ITO, IZO, or ITZO and a metal layer such as silver or copper may be laminated one or more layers. For example, the reflective layers 211 and 221 and the electrode layers 212 and 222 may have a laminate structure of ITO/silver (Ag)/ITO.

The first reflective layer 211 and the first electrode layer 212, which may be disposed on the first bank 410, constitute the first electrode 210. The first electrode 210 may protrude to a region extending from both ends of the first bank 410, and thus the first electrode 210 may be in contact with the insulating substrate layer 200 in the protruding region. The second reflective layer 221 and the second electrode layer 222, which may be disposed on the second bank 420, constitute the second electrode 220. The second electrode 220 may protrude to a region extending from both ends of the second bank 420, and thus the second electrode 220 may be in contact with the insulating substrate layer 200 in the protruding region.

The first electrode 210 and the second electrode 220 may be disposed to cover or overlap the entire region of the first bank 410 and the entire region of the second bank 420, respectively. However, as described above, the first electrode 210 and the second electrode 220 may be spaced apart from each other and face each other. As will be described later, a first insulating material layer 510 may be disposed between the first electrode 210 and second electrode 220 spaced apart from each other, and the light emitting element 300 may be disposed on the first insulating material layer 510.

Further, the first reflective layer 211 may receive a driving voltage from the first thin film transistor 120, and the second reflective layer 221 may receive a power supply voltage from the power supply wiring 161, so that the first electrode 210 and the second electrode 220 receive a driving voltage and a power supply voltage, respectively. The first electrode 210 may be electrically connected to the first thin film transistor 120, and the second electrode 220 may be electrically connected to the power supply wiring 161. Accordingly, the first contact electrode 261 and the second contact electrode 262 disposed on the first electrode 210 and the second electrode 220 may receive the driving voltage and the power supply voltage. The driving voltage and the power supply voltage may be transmitted to the light emitting element 300, and a predetermined current flows through the light emitting element 300, so as to emit light.

The first insulating material layer 510 is disposed on the first electrode 210 and the second electrode 220 to partially cover or overlap them. The first insulating material layer 510 may be disposed so as to cover or overlap most of the upper surfaces of the first electrode 210 and the second electrode 220, and may exposed a part of the first electrode 210 and a part of the second electrode 220. The first insulating material layer 510 may be disposed in a space between the first electrode 210 and second electrode 220. The first insulating material layer 510 may have a substantially island or isolated shape or a substantially linear shape formed along a space between the first electrode branch portion 210B and the second electrode branch portion 220B in a plan view.

It is shown in FIG. 2 that the first insulating material layer 510 is disposed in a space between one first electrode 210 (for example, the first electrode branch portion 210B) and one second electrode 220 (for example, the second electrode branch portion 220B). However, as described above, since the number of the first electrodes 210 may be plural and the number of the second electrodes 220 may be plural, the first insulating material layer 510 may be also disposed between one first electrode 210 and another second electrode 220 or between one second electrode 220 and another first electrode 210. Further, the first insulating material layer 510 may be disposed on sides opposite to the facing sides of the first electrode 210 and the second electrode 220 so as to partially cover or overlap them. For example, the first insulating material layer 510 may be disposed so as to expose the centers of the first electrode 210 and the second electrode 220.

The light emitting element 300 is disposed on the first insulating material layer 510. The first insulating material layer 510 may be disposed between the light emitting element 300 and the insulating substrate layer 200. The lower surface of the first insulating material layer 510 may be in contact with the insulating substrate layer 200, and the light emitting element 300 may be disposed on the upper surface of the first insulating material layer 510. Further, both side surfaces of the first insulating material layer 510 may be in contact with the first electrode 210 and the second electrode 220 to electrically insulate them from each other.

The first insulating material layer 510 may overlap a part of a region on each of the electrodes 210 and 220, for example, a part of a region protruding in a direction in which the first electrode 210 and the second electrode 220 face each other. The first insulating material layer 510 may also be disposed in a region where the inclined side surface and flat upper surfaces of each of the banks 410 and 420 overlap each of the electrodes 210 and 220.

For example, the first insulating material layer 510 may cover or overlap each end protruding in a direction in which the first electrode 210 and the second electrode 220 face each other. The first insulating material layer 510 may be in contact with a part of the lower surface of the insulating substrate layer 200, and may be in contact with the side surface of each of the electrodes 210 and 220 and a part of the lower surface of each of the electrodes 210 and 220. Therefore, the first insulating material layer 510 may protect the region overlapping each of the electrodes 210 and 220, and electrically insulate them from each other. Further, the first insulating material layer 510 may prevent the first conductive semiconductor layer 310 and second conductive semiconductor layer 320 of the light emitting element 300 from being in direct contact with other substrates to prevent the damage of the light emitting element 300.

However, the disclosure is not limited thereto, and the first insulating material layer 510 may be disposed only in the region overlapping the inclined surfaces of the banks 410 and 420 among the regions on the first electrode 210 and the second electrode 220. In this case, the lower of the first insulating material layer 510 is terminated at the inclined surface of each of the banks 410 and 420, and each of the electrodes 210 and 220 disposed on a part of the inclined surface of each of the banks 410 and 420 is exposed to be in contact with the contact electrode 260.

Further, the first insulating material layer 510 may be disposed such that both ends of the light emitting element 300 may be exposed. Accordingly, the contact electrode 260 may be in contact with the exposed upper surface of each of the electrodes 210 and 220 and both ends of the light emitting element 300, and the contact electrode 260 may transmit an electrical signal applied to the first electrode 210 and the second electrode 220 to the light emitting element 300.

At least one light emitting element 300 may be disposed between the first electrode 210 and the second electrode 220. Although it is shown in FIG. 2 that two light emitting elements 300 may be disposed between the first electrode 210 and the second electrode 220 in a cross-section, it may be appreciated that, as shown in FIG. 1, the plurality of light emitting elements 300 may be arranged or disposed in a different direction (for example, second direction D2) in a plan view.

As an example, one or an end of the light emitting element 300 may be electrically connected to the first electrode 210, and the other or another end thereof may be electrically connected to the second electrode 220. Both ends of the light emitting element 300 may be in contact with the first contact electrode 261 and the second contact electrode 262, respectively.

Meanwhile, although it is illustrated in FIG. 1 that only the light emitting elements 300 emitting light of the same color may be arranged or disposed in each pixel PX, the disclosure is not limited thereto. As described above, the light emitting elements 300 emitting light of different colors from each other may be arranged or disposed in one pixel PX.

The light emitting element 300 may be a light emitting diode. The light emitting element 300 may be a nanostructure whose size is generally nanometer. The light emitting element 300 may be an inorganic light emitting diode including an inorganic material. In the case where the light emitting element 300 may be an inorganic light emitting diode, in a case that a light emitting material having an inorganic crystal structure is disposed between two electrodes facing each other and an electric field is formed in the light emitting material in a specific or predetermined direction, the inorganic light emitting diode may be aligned between the two electrodes in which a specific or predetermined polarity may be formed.

In an embodiment, the light emitting element 300 may include a first conductive semiconductor layer 310, an element active material layer 330, a second conductive semiconductor layer 320, and an electrode material layer 370, which may be sequentially laminated, and an insulating layer 380 surrounding the outer peripheral surfaces of these layers. In the laminating order of the above layers in the light emitting element 300, the first conductive semiconductor layer 310, the element active material layer 330, the second conductive semiconductor layer 320, and the electrode material layer 370 may be arranged or disposed in a direction horizontal to the insulating substrate layer 200. In other words, the light emitting element 300, in which the plurality of layers may be formed, may be disposed in a horizontal direction horizontal to the insulating substrate layer 200. However, the disclosure is not limited thereto, and the light emitting element 300 may be aligned such that the aforementioned laminating direction is reversed between the first electrode 210 and the second electrode 220.

Further, although it is shown in FIG. 2 that only one light emitting element 300 is disposed, as described above, a plurality of light emitting elements 300 having different diameters from each other may be arranged or disposed between the first electrode 210 and the second electrode 220. Details of the light emitting element will be described later.

The second insulating material layer 520 may be disposed to overlap at least a part of the region on the light emitting element 300. The second insulating material layer 520 may protect the light emitting element 300, and may fix the light emitting element 300 between the first electrode 210 and the second electrode 220.

Although it is shown in FIG. 2 that the second insulating material layer 520 is disposed only on the upper surface of the light emitting element 300 in a schematic cross-sectional view, the second insulating material layer 520 may be disposed to surround the outer surface of the light emitting element 300. For example, like the first insulating material layer 510, the second insulating material layer 520 may be disposed to extend in the second direction D2 along a space between the first electrode branch portion 210B and the second electrode branch portion 220B so as to have a substantially island or isolated shape or a substantially linear shape in a plan view.

Further, a part of the material of the second insulating material layer 520 may be disposed even in a region where the lower surface of the light emitting element 300 is contact with the first insulating 510. This configuration may be formed in a case that the light emitting element 300 may be aligned on the first insulating material layer 510 and the second insulating material layer 520 is disposed on the first insulating material layer 510 at the time of manufacturing the display device 10. In a case that some or a predetermined number voids may be formed in the first insulation layer 510 contacting the lower surface of the light emitting element 300, a part of the material of the second insulating material layer 520 penetrates into the voids in a case that the second insulating material layer 520 may be formed, so as to form the configuration.

The second insulating material layer 520 is disposed such that both side surfaces of the light emitting element 300 may be exposed. For example, since the length of the second insulating material layer 520 disposed on the upper surface of the light emitting element 300 in the cross-section, measured in the uniaxial direction, may be shorter than the length of the light emitting element 300, the second insulating material layer 520 may be recessed inwardly from both side surfaces of the light emitting element 300. Accordingly, the side surfaces of the first insulating material layer 510, the light emitting element 300, and the second insulating material layer 520 may be laminated stepwise. In this case, the contact electrodes 261 and 262 to be described later may be brought into smooth contact with both ends of the light emitting element 300. However, the disclosure is not limited thereto, and the length of the second insulating material layer 520 may be matched with the length of the light emitting element 300, so that both sides thereof may be aligned with each other.

Meanwhile, the second insulating material layer 520 may be disposed to cover or overlap the first insulating material layer 510 and then patterned in a region where the light emitting element 300 is exposed to be contact with the contact electrode 260. The process of patterning the second insulating material layer 520 may be performed by a general dry etching or wet etching method. Here, in order to prevent the first insulating material layer 510 from being patterned, the first insulating material layer 510 and the second insulating material layer 520 may include materials having different etching selection ratios from each other. In other words, in a case that patterning the second insulating material layer 520, the first insulating material layer 510 may function as an etching stopper.

Accordingly, even in a case that the second insulating material layer 520 may cover or overlap the outer surface of the light emitting element 300 and may be patterned to expose both ends of the light emitting element 300, the material of the first insulating material layer 510 may not be damaged. As an example, the first insulating material layer 510 and the light emitting element 300 may form a smooth contact surface at both ends of the light emitting element 300, at which the light emitting element 300 may be in contact with the contact electrode 260.

The first contact electrode 261 disposed on the first electrode 210 and overlapping at least a part of the second insulating material layer 520, and the second contact electrode 262 disposed on the second electrode 220 and overlapping at least a part of the second insulating material layer 520 may be disposed on the second insulating material layer 520.

The first contact electrode 261 and the second contact electrode 262 may be disposed on the upper surface of the first electrode 210 and the upper surface of the second electrode 220, respectively. As an example, the first contact electrode 261 and the second contact electrode 262 may be in contact with the first electrode layer 212 and the second electrode layer 222, respectively, in the region where the first insulating material layer 510 is patterned to expose a part of the first electrode 210 and a part of the second electrode 220. Each of the first contact electrode 261 and the second contact electrode 262 may be in contact with one end side surface of the light emitting element 300, for example, the first conductive semiconductor layer 310, the second conductive semiconductor layer 320, or the electrode material layer 370. Thus, the first contact electrode 261 and the second contact electrode 262 may transmit electrical signals applied to the first electrode layer 212 and the second electrode layer 222 to the light emitting element 300.

The first contact electrode 261 may be disposed on the first electrode 210 to partially cover or overlap the first electrode 210, and may be partially in contact with the light emitting element 300, the first insulating material layer 510, and the second insulating material layer 520. One end of the first contact electrode 261 in the direction in which the second contact electrode 262 is disposed may be disposed on the second insulating material layer 520. The second contact electrode 262 may be disposed on the second electrode 220 to partially cover or overlap the second electrode 220, and may be partially in contact with the light emitting element 300, the first insulating material layer 510, and a third insulating material layer 530. One end of the second contact electrode 262 in the direction in which the first contact electrode 261 is disposed may be disposed on the third insulating material layer 530.

Areas where the first insulating material layer 510 and the second insulating material layer 520 may be disposed to cover or overlap the first electrode 210 and the second electrode 220 on the upper surfaces of the first bank 410 and the second bank 420 may be patterned. Accordingly, the first electrode layer 212 of the first electrode 210 and the second electrode layer 222 of the second electrode 220 may be exposed to be electrically connected to the contact electrodes 261 and 262, respectively.

The first contact electrode 261 and the second contact electrode 262 may be disposed to be spaced apart from each other on the second insulating material layer 520 or the third insulating material layer 530. For example, the first contact electrode 261 and the second contact electrode 262 may be in contact with the second insulating material layer 520 or the third insulating material layer 530 together the light emitting element 300, but may be spaced apart from each in a lamination direction on the second insulating material layer 520 to be electrically insulated from each other. Accordingly, the first contact electrode 261 and the second contact electrode 262 may receive different powers from the first thin film transistor 120 and the power line 161. For example, the first contact electrode 261 may receive a driving voltage applied from the first thin film transistor 120 to the first electrode 210, and the second contact electrode 262 may receive a common power voltage applied from the power line 161 to the second electrode 220. However, the disclosure is not limited thereto.

The contact electrodes 261 and 262 may include a conductive material. For example, the contact electrodes 261 and 262 may include ITO, IZO, ITZO, or aluminum (Al). However, the disclosure is not limited thereto.

Further, the contact electrodes 261 and 262 may include the same or similar material as the electrode layers 212 and 222. The contact electrodes 261 and 262 may be disposed in substantially the same pattern on the electrode layers 212 and 222 so as to be in contact with the electrode layers 212 and 222. For example, the first contact electrode 261 contacting the first electrode layer 212 and the second contact electrode 262 contacting the second electrode layer 222 may receive electrical signals applied from the first electrode layer 212 and the second electrode layer 222 and transmit the electrical signals to the light emitting element 300.

The third insulating material layer 530 may be disposed on the first contact electrode 261 to electrically insulate the first contact electrode 261 and the second contact electrode 262 from each other. The third insulating material layer 530 may disposed to cover or overlap the first contact electrode 261, but may be disposed not to overlap a part of the light emitting element 300 such that the light emitting element 300 is in contact with the second contact electrode 262. The third insulating material layer 530 may partially contact the first contact electrode 261, the second contact electrode 262, and the second insulating material layer 520 on the upper surface of the second insulating material layer 520. The third insulating material layer 530 may be disposed to cover or overlap one or an end of the first contact electrode 261 on the upper surface of the second insulating material layer 520. Thus, the third insulating material layer 530 may protect the first contact electrode 261 and electrically insulate the first contact electrode 261 and the second contact electrode 262 from each other.

One end of the third insulating material layer 530 in the direction in which the second electrode 220 may be disposed may be aligned with one or a side surface of the second insulating material layer 520.

Meanwhile, in an embodiment, the third insulating material layer 530 may be omitted in the display device 10. Accordingly, the first contact electrode 261 and the second contact electrode 262 may be disposed on substantially the same plane, and the first contact electrode 261 and the second contact electrode 262 may be electrically insulated from each other by a passivation layer 550 to be described later.

The passivation layer 550 may be formed on the third insulating material layer 530 and the second contact electrode 262 to function to protect members disposed on the insulating substrate layer 200 from external environments. In a case that the first contact electrode 261 and the second contact electrode 262 may be exposed, a problem of disconnection of a contact electrode material due to electrode damage may occur, so that the passivation may cover or overlap these members. For example, the passivation layer 550 may be disposed to cover or overlap the first electrode 210, the second electrode 220, the light emitting element 300, and the like within the spirit and the scope of the disclosure. As described above, in a case that the third insulating material layer 530 is omitted, the passivation layer 550 may be formed on the first contact electrode 261 and the second contact electrode 262. In this case, the passivation layer 550 may electrically insulate the first contact electrode 261 and the second contact electrode 262 from each other.

Each of the aforementioned first insulating material layer 510, second insulating material layer 520, third insulating material layer 530, and passivation layer 550 may include an inorganic insulating material. For example, the first insulating material layer 510, the second insulating material layer 520, the third insulating material layer 530, and the passivation layer 550 may include an inorganic insulating material such as silicon oxide (SiOx), silicon nitride (SiNx), silicon oxynitride (SiOxNy), aluminum oxide ($Al_2O_3$), or aluminum nitride (AlN). The first insulating material layer 510, the second insulating material layer 520, the third insulating material layer 530, and the passivation layer 550 may include the same or similar material, but may include different materials from each other. Besides, various materials imparting insulating properties to the first insulating material layer 510, the second insulating material layer 520, the third insulating material layer 530, and the passivation layer 550 may be applicable.

Meanwhile, the first insulating material layer 510 and the second insulating material layer 520 may have different etching selection ratios, as described above. For example, in a case that the first insulating material layer 510 may include silicon oxide (SiOx), the second insulating material layer 520 may include silicon nitride (SiNx). As another example, in a case that the first insulating material layer 510 may include silicon nitride (SiNx), the second insulating material layer 520 may include silicon oxide (SiOx). However, the disclosure is not limited thereto.

Meanwhile, the light emitting elements 300 may be manufactured on a substrate by an epitaxial growth method. The light emitting elements 300 may be manufactured by forming a seed crystal layer for forming a semiconductor layer on a substrate and depositing a desired semiconductor material on the seed crystal layer to grow the seed crystal layer. Hereinafter, a structure of the light emitting element 300 according to various embodiments will be described in detail with reference to FIG. 3.

Figure 3:
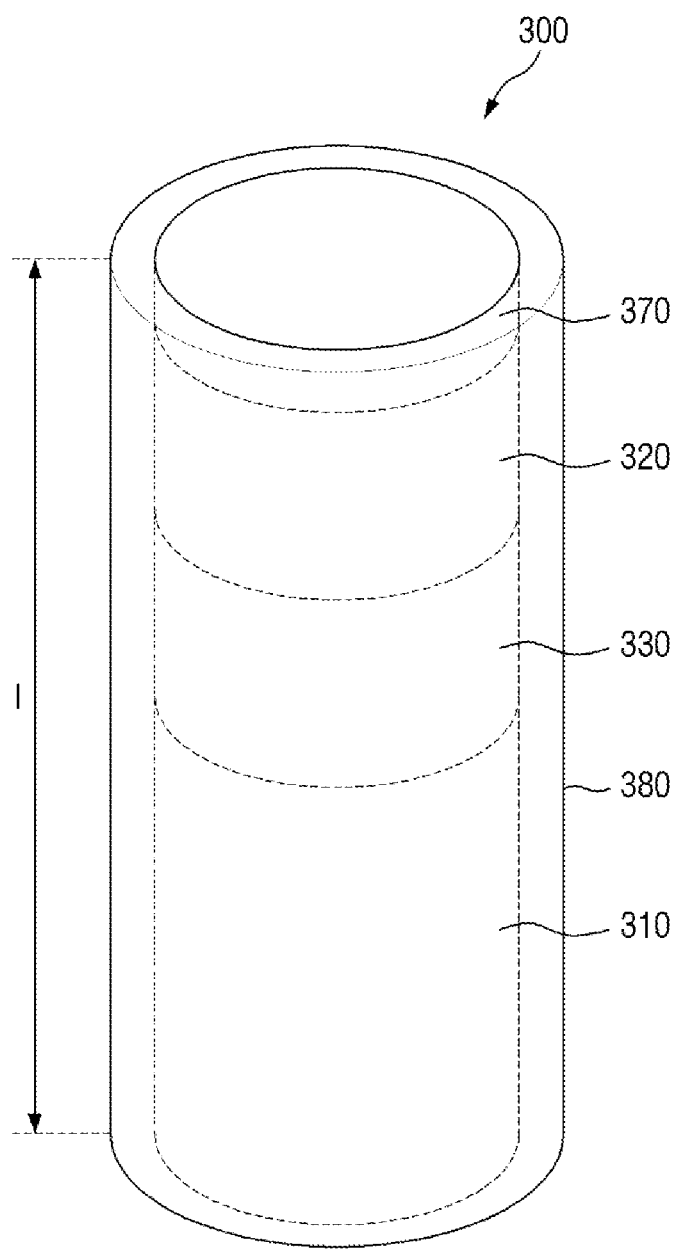
FIG. 3 is a schematic perspective view of a light emitting element according to an embodiment.

FIG. 3 is a schematic perspective view of a light emitting element according to an embodiment.

Referring to FIG. 3, the light emitting element 300 may include a plurality of conductive semiconductor layers 310 and 320, an element active material layer 330, an electrode material layer 370, and an insulating layer 380. The electrical signal applied from the first electrode 210 and the second electrode 220 may be transmitted to the element active material layer 330 through the plurality of conductive semiconductor layers 310 and 320 to emit light.

As an example, the light emitting element 300 may include a first conductive semiconductor layer 310, a second conductive semiconductor layer 320, an element active material layer 330 disposed between the first conductive semiconductor layer 310 and the second conductive semiconductor layer 320, an electrode material layer 370 disposed on the second conductive semiconductor layer 320, and an insulating layer 380. Although it is shown in FIG. 3 that the light emitting element 300 has a structure in which the first conductive semiconductor layer 310, the element active material layer 330, the second conductive semiconductor layer 320, and the electrode material layer 370 may be sequentially laminated, the disclosure is not limited thereto. The electrode material layer 370 may be omitted, and in an embodiment, the electrode material layer 370 may also be disposed on at least one of both side surfaces of the first conductive semiconductor layer 310 and the second conductive semiconductor layer 320. Hereinafter, the light emitting element 300 of FIG. 3 will be described as an example, and it may be appreciated that a description of the light emitting element 300 to be described later may be equally applied even if the light emitting element 300 further may include other structures.

The first conductive semiconductor layer 310 may be an n-type semiconductor layer. For example, in a case that the light emitting element 300 emits light of a blue wavelength band, the first conductive semiconductor layer 310 may be a semiconductor material having Formula of $In_xAl_yGa_{1-x-y}N$ ($0 \leq x \leq 1$, $0 \leq y \leq 1$, $0 \leq x+y \leq 1$). For example, the semiconductor material may be at least one of InAlGaN, GaN, AlGaN, InGaN, AlN, and InN, which may be doped with an n-type semiconductor. The first conductive semiconductor layer 310 may be doped with a first conductive dopant, and, for example, the first conductive dopant may be Si, Ge, Sn, or the like within the spirit and the scope of the disclosure. The length of the first conductive semiconductor layer 310 may be in the range of about 1.5 μm to about 5 μm, but is not limited thereto.

The second conductive semiconductor layer 320 may be a p-type semiconductor layer. For example, in a case that the light emitting element 300 emits light of a blue wavelength band, the second conductive semiconductor layer 320 may be a semiconductor material having Formula of $In_xAl_yGa_{1-x-y}N$ ($0 \leq x \leq 1$, $0 \leq y \leq 1$, $0 \leq x+y \leq 1$). For example, the semiconductor material may be at least one of InAlGaN, GaN, AlGaN, InGaN, AlN, and InN, which may be doped with a p-type semiconductor. The second conductive semiconductor layer 320 may be doped with a second conductive dopant, and, for example, the second conductive dopant may be Mg, Zn, Ca, Se, Ba, or the like within the spirit and the scope of the disclosure. The length of the second conductive semiconductor layer 320 may be in the range of about 0.08 μm to about 0.25 μm, but is not limited thereto.

The element active material layer 330 may be disposed between the first conductive semiconductor layer 310 and the second conductive semiconductor layer 320, and may include a material having a single or multiple quantum well structure. In a case that the element active material layer 330 may include a material having a multiple quantum well structure, the multiple quantum well structure may be a structure in which a plurality of quantum layers and a plurality of well layers may be alternately laminated. The element active material layer 330 may emit light by coupling of electron-hole pairs according to an electrical signal applied through the first conductive semiconductor layer 310 and the second conductive semiconductor layer 320. For example, in a case that the element active material layer 330 emits light of a blue wavelength band, it may include a material such as AlGaN or AlInGaN. For example, in a case that the element active material layer 330 has a multiple quantum well structure in which a plurality of quantum layers and a plurality of well layers may be alternately laminated, the quantum layer may include a material such as AlGaN or AlInGaN, and the well layer may include a material such as GaN or AlGaN. However, the disclosure is not limited thereto. The element active material layer 330 may have a structure in which semiconductor materials having high bandgap energy and semiconductor materials having low bandgap energy may be alternately laminated, and may include other Group III-V semiconductor materials depending on the wavelength band of the emitted light. Accordingly, the light emitted from the element active material layer 330 is not limited to light of a blue wavelength band, and in some cases, the element active material layer 330 may emit light of a red wavelength band or light of a green wavelength band. The length of the element active material layer 330 may be in the range of about 0.05 µm to about 0.25 µm, but is not limited thereto.

The light emitted from the element active material layer 330 may be emitted not only onto the outer surface of the light emitting element 300 in the length direction but also onto both side surfaces thereof. For example, the direction of the light emitted from the element active material layer 330 is not limited to one direction.

Meanwhile, the element active layer 330 of the light emitting element 300 may have a different wavelength band of emitted light according to a difference in composition.

For example, the element active layer 330 may emit light of different colors depending on the kind of active material of the element active layer 330, but a deviation in emission wavelength may occur depending on the composition ratio in the element active layer 330 and the lattice strain of semiconductor crystals even if the element active layer 330 may include the same kind of active material. In other words, the element active layer 330 may include the same kind of active material to have any band gap energy, but in a case that manufacturing the light emitting element 300, bandgap energy varies depending the lattice strain of active material crystals formed in the element active layer 330, and thus, a deviation in wavelength band of emitted light may occur.

Here, in a case that the plurality of light emitting elements 300 may be formed to have different diameters from each other, the lattice strain of active material crystals included in the element active layer 330 of each of the light emitting elements 300 may vary. The band gap energy of the element active layer 330 may vary according to different lattice strains between the light emitting elements 300, and thus, the wavelength of emitted light may vary.

Accordingly, based on the light emitting element 300 that emits light in an arbitrary wavelength band, the emission wavelength of the light emitting element 300 having a deviation from the light of the wavelength band may be controlled by adjusting the diameter of the light emitting element 300.

The electrode material layer 370 may be an ohmic contact electrode. However, the disclosure is not limited thereto, and the electrode material layer 370 may be a Schottky contact electrode. The electrode material layer 370 may include a conductive metal. For example, the electrode material layer 370 may include at least one of aluminum (Al), titanium (Ti), indium (In), gold (Au), and silver (Ag). The electrode material layer 370 may include the same or similar material, and may also include different materials. However, the disclosure is not limited thereto.

The insulating layer 380 may be formed outside the first conductive semiconductor 310, the second conductive semiconductor 320, the element active layer 330, and the electrode material layer 370 to protect these members. For example, the insulating layer 380 is formed to surround the side surfaces of the members, and thus may not be formed at both ends of the light emitting element 300 in the length direction, for example, at both ends thereof at which the first conductive semiconductor layer 310 and the electrode material layer 370 may be disposed. However, the disclosure is not limited thereto.

The insulating layer 380 may include a material having insulating properties such as silicon oxide (SiOx), silicon nitride (SiNx), silicon oxynitride (SiOxNy), aluminum nitride (AlN), or aluminum oxide ($Al_2O_3$). Accordingly, the insulating layer 380 may prevent an electrical short that may occur in a case that the element active layer 330 is in direct contact with the first electrode 210 or the second electrode 220. Further, since the insulating layer 380 may include the element active layer 330 to protect the outer peripheral surface of the light emitting element 300, the insulating layer 380 may prevent a decrease in light emission efficiency.

Although it is shown in the drawing that the insulating layer 380 may extend in the length direction to cover or overlap the first conductive semiconductor layer 310 to the electrode material layer 370, the disclosure is not limited thereto. The insulating layer 380 may cover or overlap only the first conductive semiconductor layer 310, the element active material layer 330, and the second conductive semiconductor layer 320, or may cover or overlap only a part of the outer surface of the electrode material layer 370 to expose a part of the outer surface of the electrode material layer 370.

The length of the insulating layer 380 may be in the range of about 0.5 µm to about 1.5 µm, but is not limited thereto.

Further, in an embodiment, the outer peripheral surface of the insulating layer 380 may be surface-treated. As described above, in a case that the light emitting elements 300 may be aligned between the electrodes 210 and 220, the light emitting elements 300 may be applied in a dispersed state in a solution. Here, the insulating layer 380 may be hydrophobically or hydrophilically surface-treated, so that the light emitting elements 300 may be maintained in a state in which the light emitting elements 300 may be dispersed with each other in the solution. Accordingly, in a case that aligning the light emitting elements 300, the aligning the light emitting elements 300 may be aligned between the first electrode 210 and the second electrode 220 without being aggregated.

The light emitting element 300 may be cylindrical. Accordingly, the schematic cross-sectional view of the light emitting element 300 taken in a length direction traversing both ends of the light emitting element 300 may have a substantially rectangular shape. However, the shape of the light emitting element 300 is not limited thereto, and may have various shapes such as a substantially cube shape, a substantially rectangular parallelepiped shape, and a substantially hexagonal column shape. The length of the light emitting element 300 may be in the range of about 1 µm to about 10 µm or about 2 µm to about 5 µm, and, for example, may be about 4 µm. Further, the diameter of the light emitting element 300 may be in the range of about 300 nm to about 700 nm, and as described above, the plurality of light emitting elements 300 included in the display device 10 may have different diameters from each other depending on a difference in composition of the element active layer 330. The length of the light emitting element 300 may be about 500 nm.

Meanwhile, as described above, the plurality of light emitting elements 300 may have different diameters from each other. In an embodiment, the difference in diameter between any light emitting element 300 and another light emitting element 300 having a different diameter may range from about 2% to about 16% of the diameter of the any light emitting element 300. For example, in a case that any light emitting element, for example, the second light emitting element 302 may have a diameter of about 500 nm, the first light emitting element 301 may have a diameter in the range of about 420 nm to about 490 nm, and the third light emitting element 303 may have a diameter in the range of about 510 nm to about 580 nm. However, the disclosure is not limited thereto, and as will be described later, the diameters of the light emitting elements 300 may vary depending on a difference in composition of the element active layer 330.

Hereinafter, for convenience, the light emitting element 300 illustrated in FIG. 3 will be described as an example, but as described above, this case may be equally applied even to the case of including a larger number of electrode material layers 370 or further including other structures.

Figure 4:
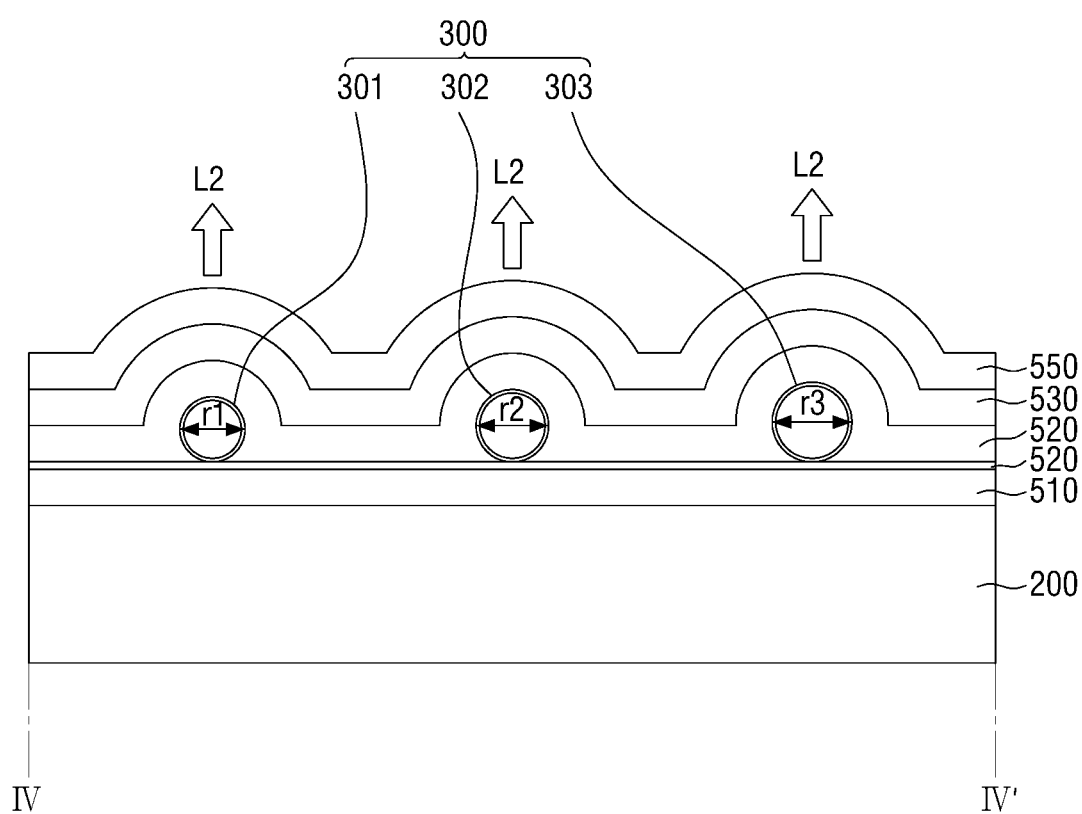
FIG. 4 is a schematic cross-sectional view taken along the line IV-IV' of FIG. 1.

Meanwhile, FIG. 4 is a schematic cross-sectional view taken along the line IV-IV' of FIG. 1.

The line IV-IV' of FIG. 1 may be a line traversing the center of both ends of the light emitting element 300 aligned in the first direction D1 between the first electrode 210 and the second electrode 220, and FIG. 4 is a schematic cross-sectional view taken along the line traversing the centers of both ends of the plurality of light emitting elements 300.

Referring to FIGS. 2 and 4, the lower surfaces of a first light emitting element 301, a second light emitting element 302, and a third light emitting element 303 may partially be in contact with the first insulating material layer 510 and the second insulating material, and the upper surfaces thereof may be fixed between the first electrode 210 and the second electrode 220 by the second insulating material layer 520. The third insulating material layer 530 and the passivation layer 550 may be formed on the second insulating material layer 520, and the structure shown in FIG. 4 is the same as that described with reference to FIGS. 1 and 2.

The plurality of light emitting elements 300 included in the display device 10 may include a first light emitting element 301, a second light emitting element 302, and a third light emitting element 303, which have different diameters from each other. The first light emitting element 301, the second light emitting element 302, and the third light emitting element 303 have different diameters from each other, but may emit light of substantially the same wavelength band.

The diameter r2 of the second light emitting element 302 may be larger than the diameter r1 of the first light emitting element 301 but smaller than the diameter r3 of the third light emitting element 303. In other words, the first light emitting element 301, the second light emitting element 302, and the third light emitting element 303 may be formed such that diameters sequentially increase. This may be mean that the diameter of the light emitting element 300 may be adjusted in a case that manufacturing the light emitting element 300 such that the wavelength band of light emitted from the element active layer 330 of each of the light emitting elements 300 may be shifted.

As described above, in a case that manufacturing the light emitting element 300, the element active layers 330 of the plurality of light emitting elements 300 may have different compositions from each other, and thus, the light emitting elements 300 may have different band gap energies from each other. For example, in a case that the first light emitting element 301, the second light emitting element 302, and the third light emitting element 303 grown on the same wafer substrate each have the same diameter, the element active layers 330 of the light emitting elements 300 may emit light of different wavelengths. The element active layer 330 of the first light emitting element 301 may emit first light L1 of a first wavelength band, the element active layer 330 of the second light emitting element 302 may emit second light L2 of a second wavelength band, and the element active layer 330 of the third light emitting element 303 may emit third light L3 of a third wavelength band.

Here, in a case that the second light L2, which is light emitted by the element active layer 330 of the second light emitting element 302, is set to a reference, light emitted by the element active layers 330 of the first light emitting element 301 and the third light emitting element 303 may have a wavelength band deviation from the second light L2. However, in order to minimize the deviation in wavelength of light emitted by the light emitting elements 300, the light emitting elements 300 may have different diameters, so that emission wavelengths may be shifted. The first light emitting element 301, the second light emitting element 302, and the third light emitting element 303 may be shifted to emit light having substantially the same wavelength by controlling the lattice strain of the element active layer 330 by varying the diameter of each of the light emitting elements 300.

As an example, the diameter r1 of the first light emitting element 301 may be smaller than the diameter r2 of the second light emitting element 302, and the light emitted from the element active layer 330 of the first light emitting element 301 may be blue-shifted such that the wavelength thereof becomes shorter from the first light L1 to the second light L2. Further, the diameter r3 of the third light emitting element 303 may be larger than the diameter r2 of the second light emitting element 302, and the light emitted from the element active layer 330 of the third light emitting element 303 may be red-shifted such that the wavelength thereof becomes longer from the third light L3 to the second light L2. Accordingly, the first light emitting element 301, the second light emitting element 302, and the third light emitting element 303 may emit light of substantially the same wavelength band, for example, the second light L2. However, the disclosure is not limited thereto, and the plurality of light emitting elements 300 included in the display device 10 may include a larger number of light emitting elements 300 having different diameters.

As described above, in a case that the first light emitting element 301, the second light emitting element 302, and the third light emitting element 303 having different diameters may be manufactured by forming an etching pattern layer 1700 (shown in FIG. 8) including nanopatterns 1710, 1720, and 1730 (shown in FIG. 8) having different diameters from each other. In the step of vertically etching a semiconductor structure 3000 (shown in FIG. 6) grown on the wafer substrate, the nanopatterns 1710, 1720, and 1730 having different diameters from each other may be formed, and thus the finally manufactured light emitting elements 300 have different diameters, but may emit light of substantially the same wavelength band. Accordingly, the plurality of light emitting elements 300 may minimize deviations in emission wavelengths, and the display device 10 according to an embodiment may improve the purity and reliability of light emitted from each pixel PX.

Hereinafter, a method of manufacturing the light emitting element 300 according to an embodiment will be described in detail with reference to FIGS. 5 to 16.

FIGS. 5 to 16 are schematic cross-sectional views schematically illustrating a method of manufacturing a light emitting element according to an embodiment.

Figure 5:
FIGS. 5 and 6 are schematic cross-sectional views schematically illustrating a method of forming a semiconductor structure according to an embodiment.
Figure 6:
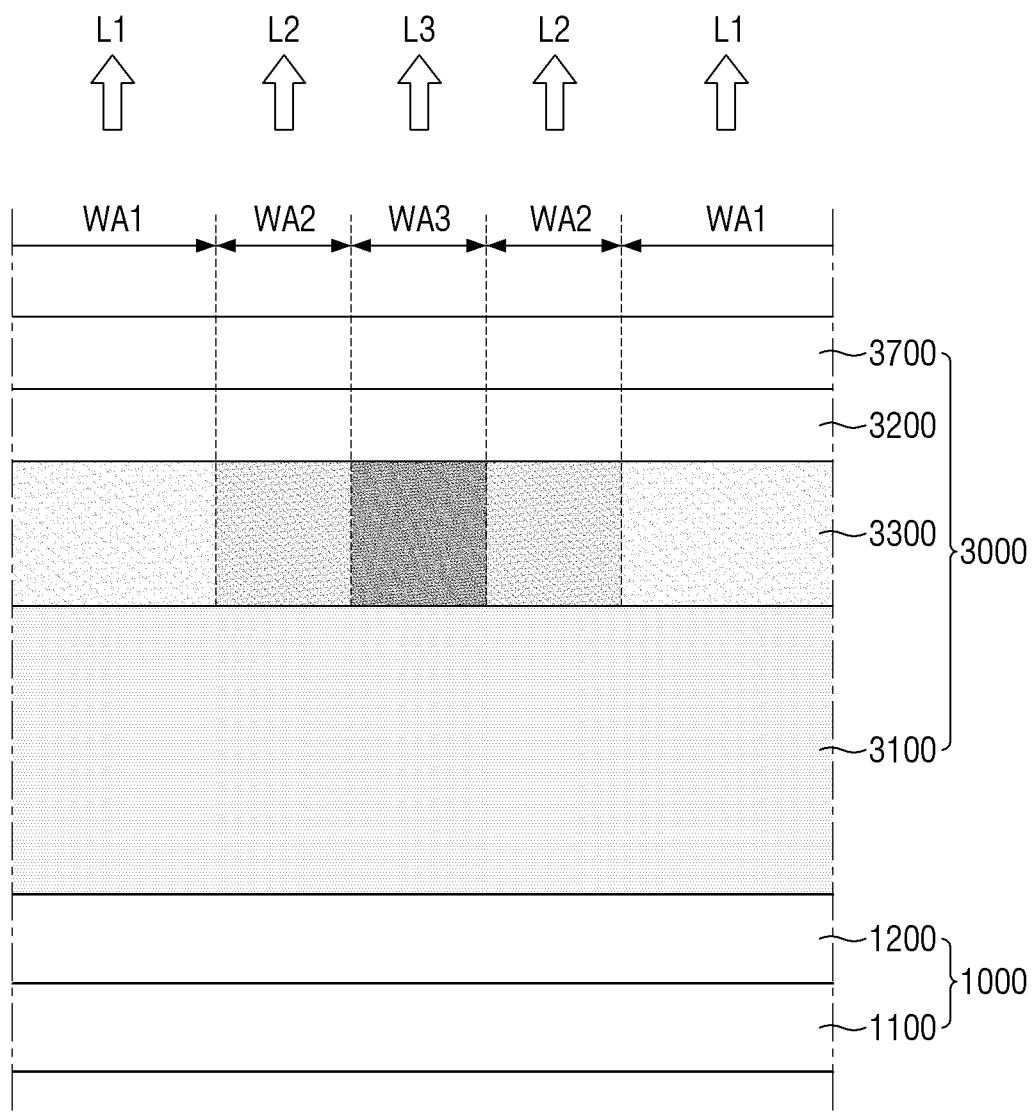

FIGS. 5 and 6 are schematic cross-sectional views schematically illustrating a method of forming a semiconductor structure according to an embodiment.

First, referring to FIG. 5, a lower substrate layer 1000 including a base substrate 1100 and a buffer material layer 1200 formed on the base substrate 1100 is prepared. As shown in FIG. 5, the lower substrate layer 1000 may have a structure in which the base substrate 1100 and the buffer material layer 1200 may be sequentially laminated.

The base substrate 1100 may be a sapphire substrate ($Al_2O_3$) or a transparent substrate such as a glass substrate. However, the disclosure is not limited thereto, and the base substrate 1100 may be a conductive substrate including GaN, SiC, ZnO, Si, GaP, or GaAs. Hereinafter, a case where the base substrate 1100 may be a sapphire substrate ($Al_2O_3$)

will be described. The thickness of the base substrate 1100 is not particularly limited, but for example, the base substrate 1100 may have a thickness ranging from 400 μm to 1500 μm.

A plurality of conductive semiconductor layers may be formed on the base substrate 1100. The plurality of conductive semiconductor layers grown by an epitaxial method may be grown by forming seed crystals and depositing a crystal material thereon. Here, the conducive semiconductor layer may be formed by electron beam deposition, physical vapor deposition (PVD), chemical vapor deposition (CVD), plasma laser deposition (PLD), dual-type thermal evaporation, sputtering, or metal organic chemical vapor deposition (MOCVD), and may be formed by metal organic chemical vapor deposition (MOCVD). However, the disclosure is not limited thereto.

The precursor material for forming the plurality of conductive semiconductor layers is not particularly limited within a range that may be normally selected to form a target material. For example, the precursor material may be a metal precursor containing an alkyl group such as a methyl group or an ethyl group. For example, the precursor material may be a compound such as trimethyl gallium (Ga(CH3)3), trimethyl aluminum (Al(CH3)3), or triethyl phosphate ((C2H5)3PO4), but is not limited thereto. Hereinafter, a method of forming a plurality of conductive semiconductor layers, process conditions thereof, and the like will be omitted, and a sequence of a method of manufacturing the light emitting element 300 and a laminate structure of the light emitting element 300 will be described in detail.

The buffer material layer 1200 is formed on the base substrate 1100. Although it is shown in the drawing that one buffer material layer 1200 is laminated, the disclosure is not limited thereto, and a plurality of buffer material layers 1200 may be formed. The buffer material layer 1200 may be disposed on the base substrate 1100 to reduce a difference in lattice constant of a first conductive semiconductor layer 3100. In a step to be described later, the buffer material layer 1200 may provide seed crystals such that crystals of the first conductive semiconductor layer 3100 may be easily grown thereon.

As an example, the buffer material layer 1200 may include an undoped semiconductor, and may include substantially the same or similar material as the first conductive semiconductor layer 3100, but may include a material not doped with an n-type or p-type dopant. In an embodiment, the buffer material layer 1200 may include at least one of InAlGaN, GaN, AlGaN, InGaN, AlN, and InN, which may not be doped, but the material thereof is not limited thereto.

Meanwhile, although not shown in FIG. 5, a separation layer 1300 (shown in FIG. 21) may be further disposed on the buffer material layer 1200. As will be described later, the separation layer 1300 may be disposed on the buffer material layer 1200 to perform a chemical separation method (Chemical Lift OFF, CLO) for removing the separation layer 1300 in a case that separating element rods ROD from the lower substrate layer 1000. Accordingly, the end surface of the manufactured light emitting element 300 may be formed relatively flat. For a more detailed description, reference is made to other embodiments.

Next, referring to FIG. 6, a first conductive semiconductor layer 3100, an active material layer 3300, a second conductive semiconductor layer 3200, and a conductive electrode material layer 3700 may be formed on the buffer material layer 1200 of the lower substrate layer 1000 to form a semiconductor structure 3000.

Figure 12:
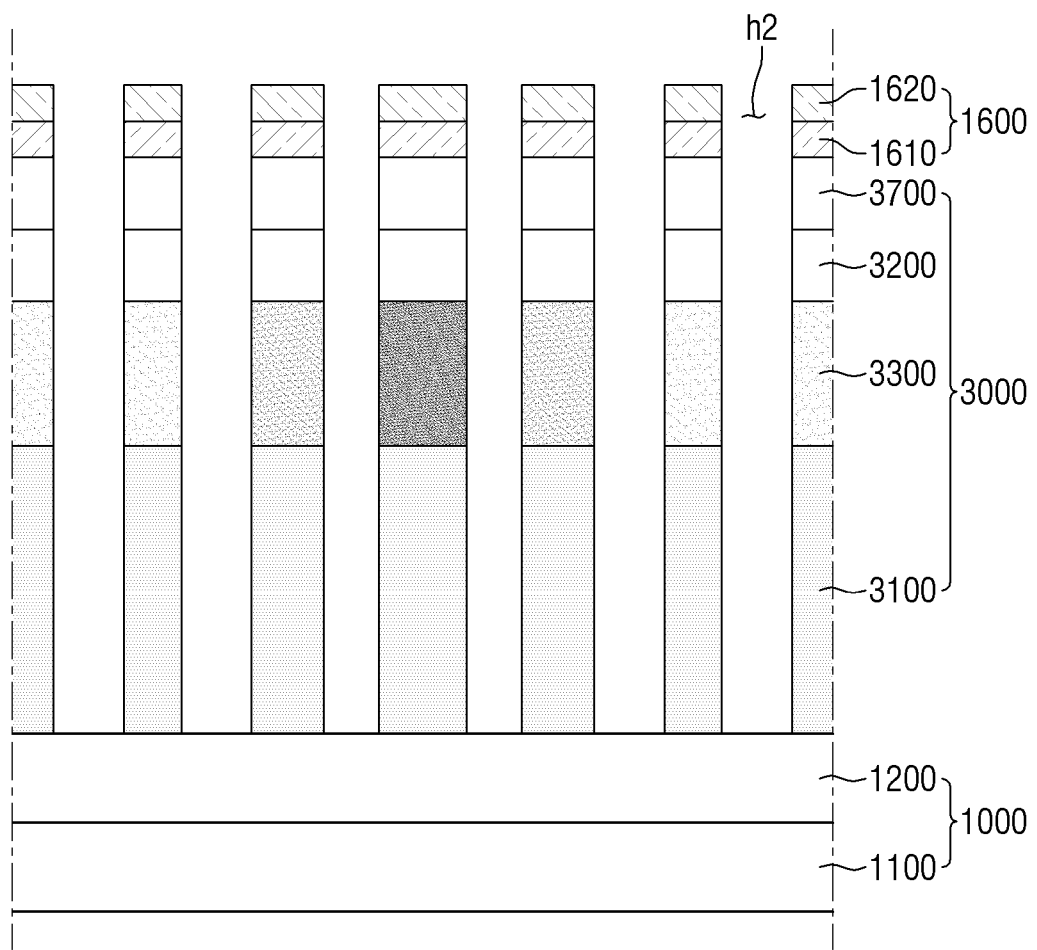
Figure 13:
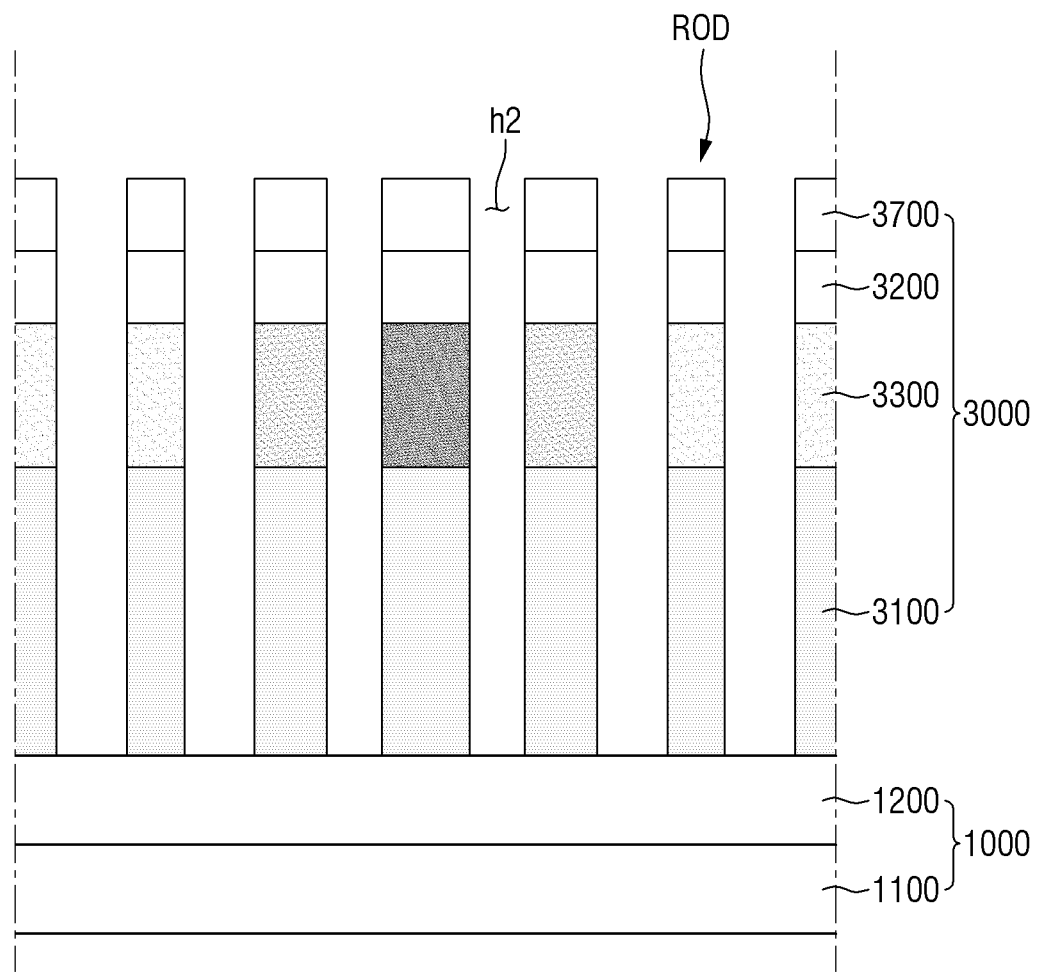

The semiconductor structure 3000 may be partially etched in a step to be described later to form element rods ROD (shown in FIG. 12). The plurality of material layers included in the semiconductor structure 3000 may be formed by performing a process as described above. The first conductive semiconductor layer 3100, the active material layer 3300, the second conductive semiconductor layer 3200, and the conductive electrode material layer 3700 may be sequentially formed on the separation layer 1300, and each of them may include the same or similar materials as the first conductive semiconductor 310, element active layer 330, second conductive semiconductor 320, and electrode material layer 370 of the light emitting element 300.

Although not shown in the drawing, the light emitting element 300 may omit the electrode material layer 370, or may further include another electrode material layer 370 under or below the first conductive semiconductor 310. In other words, different from FIG. 6, in the semiconductor structure 3000, the conductive electrode material layer 3700 may be omitted, or another conductive electrode material layer may be formed under or below the first conductive semiconductor layer 3100. However, hereinafter, a case where the semiconductor structure 3000 may include the conductive electrode material layer 3700 will be described as an example.

Figure 7:
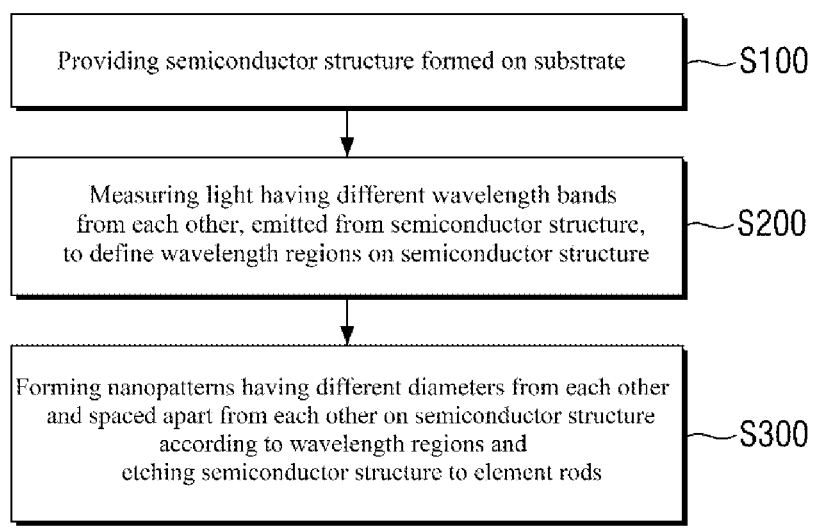
FIG. 7 is a flowchart illustrating a step of forming element rods in the method of manufacturing a light emitting element according to an embodiment.

FIG. 7 is a flowchart illustrating a step of forming element rods in the method of manufacturing a light emitting element according to an embodiment.

Referring to FIG. 7, the method of manufacturing a light emitting element according to an embodiment may include the steps of: (S100) forming a semiconductor structure 3000 on a lower substrate layer 1000; (S200) measuring light having different wavelength bands from each other, emitted from the semiconductor structure 3000, to define or form a wavelength region WA on the semiconductor structure 3000; and (S300) forming nanopatterns 1710, 1720, and 1730 having different diameters and spaced apart from each other on the semiconductor structure 3000 according to the wavelength region WA and etching the semiconductor structure 3000 to forming element rods ROD. It will be appreciated from the drawings, that the wavelength region WA may include at least a first wavelength region WA1 in which a first light L1 may be emitted, a second wavelength region WA2 in which a second light L2 may be emitted, and a third wavelength region WA3 in which a third light L3 may be emitted. However, the disclosure is not limited thereto.

Depending on the performance or quality of a manufacturing apparatus, the semiconductor structure 3000 formed on the lower substrate layer 1000 may have an area where its composition thereof is partially uneven according to its spatial position. For example, in a case that the semiconductor structure 3000 is formed by metal-organic chemical vapor deposition (MOCVD), a precursor material provided or disposed on the lower substrate layer 1000 may be in the form of a gas phase. The gas-phased precursor material may be provided or disposed on the lower substrate layer 1000 in a non-uniform distribution, and accordingly, the semiconductor structure 3000 formed by depositing the precursor material may have a non-uniform composition according to a spatial position.

Here, in a case that a difference in composition difference of the active material layer 3300 occurs according to a spatial position, the plurality of light emitting elements 300 manufactured to have the same diameter may include the element active layers 330 having different compositions from each other. In this case, the plurality of light emitting elements 300 manufactured at different positions in the semiconductor structure 3000 may have a deviation in wavelength band of emitted light.

Therefore, in order to minimize the deviation in emission wavelength band that may occur in the plurality of light emitting elements 300, the method of manufacturing the light emitting element 300 according to an embodiment may further include the step of forming etching pattern layers 1700 having different sizes from each other in the step of etching the semiconductor structure 3000 in a direction perpendicular to the lower substrate layer 1000, thereby forming a plurality of element rods ROD having different diameters from each other. Accordingly, the plurality of light emitting elements 300 manufactured by performing the following steps may emit light of substantially the same wavelength band because they may have different diameters even if the element active layers 330 of the light emitting elements 300 may have different composition from each other.

The method of manufacturing a light emitting element according to an embodiment may include the step of (S200) measuring light having different wavelength bands from each other, emitted from the semiconductor structure 3000, before forming the etching pattern layer 1700 to define or form the wavelength region WA on the semiconductor structure 3000.

As described above, the semiconductor structure 3000 formed on the lower substrate layer 1000, for example, the active material layer 3300 may emit light of different wavelength bands according to a spatial position. The wavelength region WA that emits light of different wavelength bands may be formed on the semiconductor structure 3000, and accordingly, nanopatterns 1710, 1720, and 1730 having different diameters may be formed. In a step to be described later, the element rods ROD formed by the nano-patterns 1710, 1720, and 1730 having different diameters may shift the wavelength band of the emitted light according to the diameter.

FIGS. 8 to 16 are schematic cross-sectional views schematically illustrating a method of manufacturing a light emitting element according to an embodiment.

First, referring to FIGS. 8 to 13, the first conductive semiconductor layer 3100, the active material layer 3300, the second conductive semiconductor layer 3200, and the conductive electrode material layer 3700 may be etched in a direction perpendicular to the lower substrate layer 1000 to form element rods ROD. Here, the element rods ROD may be formed to have different diameters from each other.

The step of forming the element rods ROD by vertically etching the semiconductor structure 3000 may include a patterning process. According to an embodiment, the step of forming the element rods ROD by etching the semiconductor structure 3000 may include a step of forming an etching mask layer 1600 and an etching pattern layer 1700 on the semiconductor structure 3000, a step of etching the semiconductor structure 3000 according to the pattern of the etching pattern layer 1700, and a step of removing the etching mask layer 1600 and the etching pattern layer 1700.

The etching mask layer 1600 may serve as a mask for continuously etching the first conductive semiconductor layer 3100, active material layer 3300, second conductive semiconductor layer 3200, and conductive electrode material layer 3700 of the semiconductor structure 3000. The etching mask layer 1600 may include a first etching mask layer 1610 including an insulating material and a second etching mask layer 1620 including a metal.

The insulating material included in the first etching mask layer 1610 of the etching mask layer 1600 may be oxide or nitride. For example, the insulating material may be silicon oxide (SiOx), silicon nitride (SiNx), or silicon oxynitride (SiOxNy). The thickness of the first etching mask layer 1610 may be in a range of about 0.5 μm to about 1.5 μm, but is not limited thereto.

The material of the second etching mask layer 1620 is not particularly limited as long as it may be a material capable of serving as a mask for continuous etching of the semiconductor structure 3000. For example, the second etching mask layer 1620 may include chromium (Cr) or the like within the spirit and the scope of the disclosure. The thickness of the second etching mask layer 1620 may be in a range of about 30 nm to about 150 nm, but is not limited thereto.

The etching pattern layer 1700 formed on the etching mask layer 1600 may be provided with one or more nanopatterns 1710, 1720, and 1730 spaced apart from each other. The etching pattern layer 1700 may serve as a mask for continuous etching of the semiconductor structure 3000. The method of forming a pattern is not particularly limited as long as it can form a pattern using the etching pattern layer 1700 including a polymer, polystyrene spheres, silica spheres, or the like within the spirit and the scope of the disclosure.

For example, in a case that the etching pattern layer 1700 may include a polymer, a method capable of forming a pattern using a polymer may be employed. For example, the etching pattern layer 1700 including a polymer may be formed by a method such as photolithography, e-beam lithography, or nanoimprint lithography.

In an embodiment, the etching pattern layer 1700 may be formed by nanoimprint lithography, and the nanopatterns 1710, 1720, and 1730 of the etching pattern layer 1700 may include nanoimprint resin. Examples of the resin may include, but are not limited to, fluorinated monomer, acrylate monomer, dipentaerythritol hexaacrylate, dipropylene glycol diacrylate, polyethylene glycol phenyl ether acrylate, butylated hydroxy toluene (BHT), and 1-hydroxy-cyclohexylphenylketone (Irgacure 184).

The structures, shapes, and spaced intervals of the nano patterns 1710, 1720, and 1730 may be related to the shape of the finally manufactured light emitting elements 300. However, as described above, since the light emitting elements 300 may have different diameters, the sizes of the nano patterns 1710, 1720, and 1730 may be various.

In an embodiment, the diameter rn2 of the second nanopattern 1720 may be larger than the diameter rn1 of the first nanopattern 1710, but may be smaller than the diameter rn3 of the third nanopattern 1730. In other words, the first nano-pattern 1710, the second nano-pattern 1720, and the third nano-pattern 1730 may be formed such that diameters thereof sequentially increase.

Figure 8:
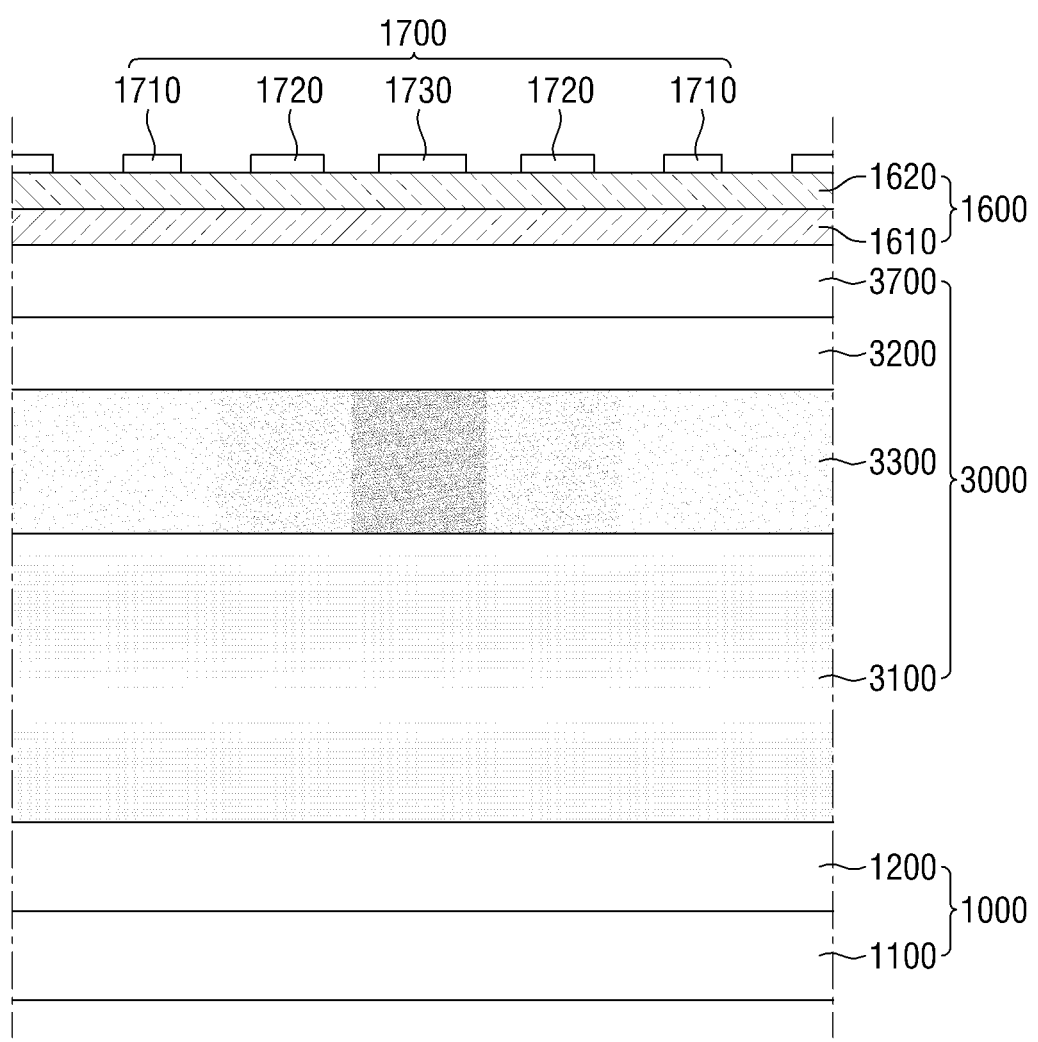
FIGS. 8 to 16 are schematic cross-sectional views schematically illustrating a method of manufacturing a light emitting element according to an embodiment.

As an example, as shown in FIG. 8, the active material layer 3300 may have a difference in composition of the material thereof according to its spatial position, and in a case that the active material layer 3300 may be deposited, a strong strain may be applied to the lattice of an active material. Accordingly, the band gap energy of the active material may vary according to the position of the active material layer 3300, and the wavelength band of the emitted light may have a deviation. As shown in FIG. 6, the semiconductor structure 3000 including the active material layer 3300 may include any space formed by a first wavelength region WA1 in which the first light L1 may be emitted, a second wavelength region WA2 in which the second light L2 may be emitted, and a third wavelength region WA3 from which the third light L3 may be emitted. The active material layer 3300 may have a difference in the composition of an active material according to each wavelength region WA, or may have different strains applied to the lattice of an active material.

The first nanopattern 1710, the second nanopattern 1720, and the third nano pattern 1730, which have different diameters from each other, may be formed on the first wavelength region WA1, the second wavelength region WA2, and the third wavelength region WA3, respectively.

Figure 9:
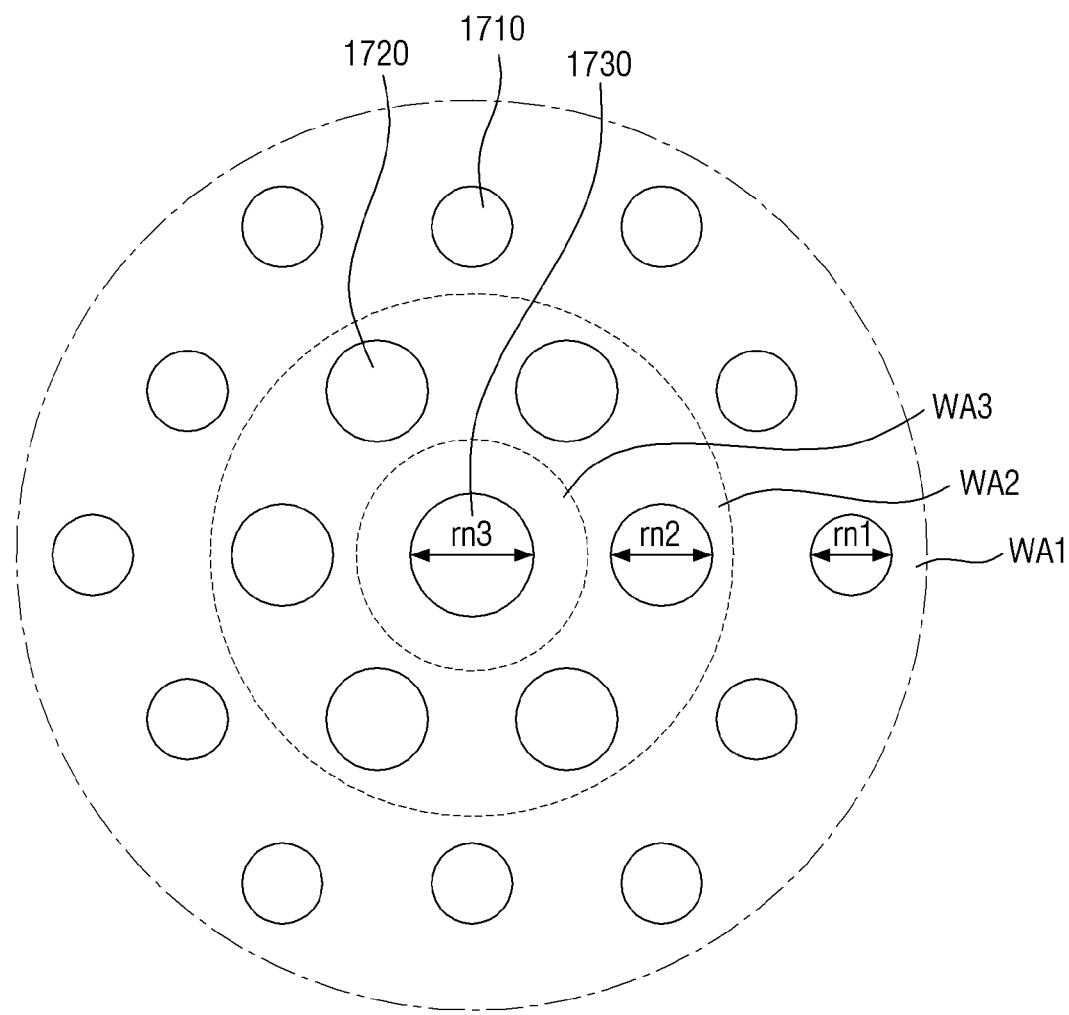
Figure 10:
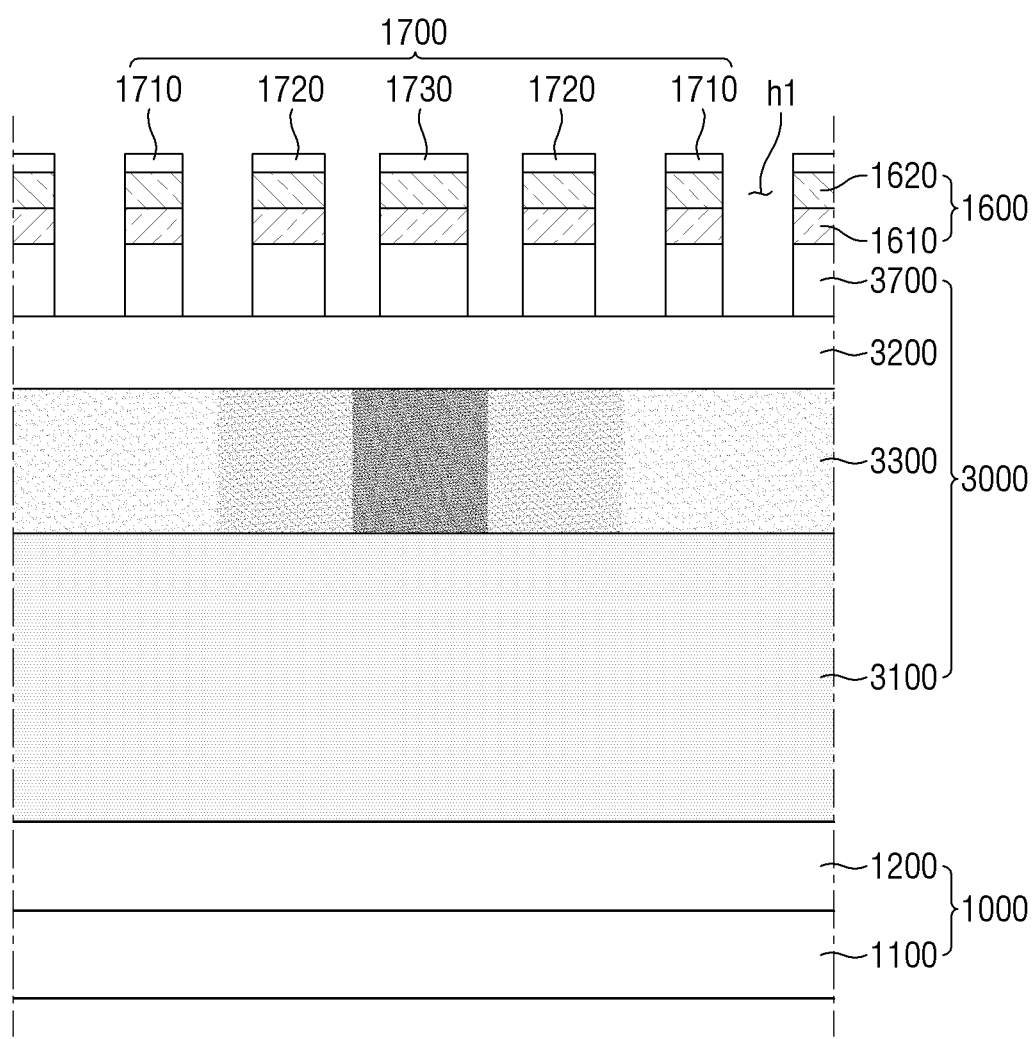
Figure 11:
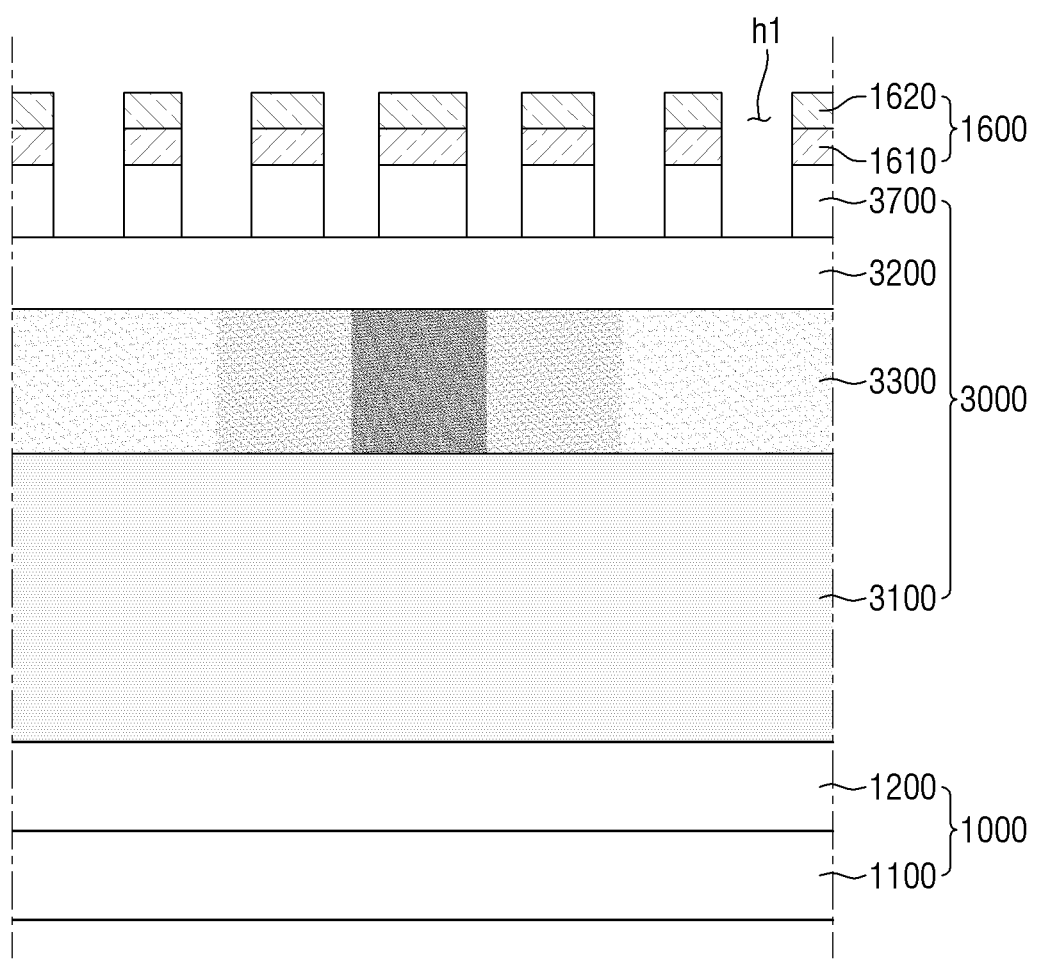

FIG. 9 is a schematic cross-sectional view of the etching pattern layer formed on the semiconductor structure of FIG. 8 as viewed from above. FIG. 9 partially shows the semiconductor structure 3000 grown on the lower substrate layer 1000 and the etching pattern layer 1700 formed thereon. In other words, in FIG. 9, only some or a predetermined number of the nanopatterns 1710, 1720, and 1730 included in the etching pattern layer 1700 are shown, and it may be appreciated that a larger number of nanopatterns 1710, 1720, and 1730 may be formed or disposed on the semiconductor structure 3000.

As shown in FIG. 9, the central portion of the semiconductor structure 3000 may be formed as a third wavelength region WA3, and a second wavelength region WA2 and a first wavelength region WA1 may be formed to surround the third wavelength region WA3. The third nanopattern 1730 may be formed on the third wavelength region WA3, the second nanopattern 1720 may be formed on the second wavelength region WA2, and the first nanopattern 1710 may be formed on the first wavelength region WA1. In FIG. 9, a wavelength region in which light of a different wavelength band is emitted may be formed as it goes outward based on the center of the semiconductor structure 3000. The light emitted from the second wavelength region WA2 may have a shorter wavelength than the light emitted from the first wavelength region WA1, and may have a longer wavelength than the light emitted from the third wavelength region WA3. In other words, the wavelength band of light emitted may increase from the center of the semiconductor structure 3000 to the outside.

At least one first nano-pattern 1710, at least one second nano-pattern 1720, and at least one third nano-pattern 1730 may be disposed in the wavelength regions, respectively, and these nanopatterns may be disposed to be spaced apart from each other. The space or structure in which the plurality of nanopatterns 1710, 1720, and 1730 may be spaced apart from each other are not particularly limited. In FIG. 8, the plurality of nanopatterns 1710, 1720, and 1730 may be arranged or disposed such that other nanopatterns surround any nanopattern. Here, six other nanopatterns may be arranged to surround the outer surface of one or a centered nanopattern, and the six nanopatterns may be divided and arranged at regular intervals. In other words, the region formed by the plurality of nanopatterns may have a substantially regular hexagonal shape. However, the disclosure is not limited thereto, and the region formed by the plurality of nanopatterns may have a substantially circular shape, a substantially polygonal shape, or the like within the spirit and the scope of the disclosure.

The interval between the plurality of nanopatterns 1710, 1720, and 1730 is not particularly limited. For example, the interval between the plurality of nanopatterns 1710, 1720, and 1730 may be larger than the diameter of each of the nanopatterns 1710, 1720, and 1730. In an embodiment, the interval between the plurality of nanopatterns 1710, 1720, and 1730 may be about two times to four times, or three times the diameter of each of the nanopatterns 1710, 1720, and 1730. The structure of each of the nanopatterns 1710, 1720, and 1730 and the interval between the nanopatterns 1710, 1720, and 1730 are not particularly limited. For example, in a case that the nanopatterns 1710, 1720, and 1730 have a substantially polygonal shape in which they may be spaced apart from each other, the light emitting element 300 manufactured by vertically etching the semiconductor structure 3000 may have a shape of a substantially polygonal column. However, the disclosure is not limited thereto.

Meanwhile, as described above, the first nanopattern 1710, the second nanopattern 1720, and the third nanopattern 1730 may have different diameters from each other. For example, among light emitting elements 300 manufactured from the semiconductor structure 3000, based on the second light emitting element 302 manufactured to have a diameter of the second nanopattern 1720 on the second wavelength region WA2 emitting the second light L2, nanopatterns of different diameters may be formed according to a difference in wavelength band between light emitted from the first wavelength region WA1 emitting the first light L1 and light emitted from the third wavelength region WA3 emitting the third light L3. For example, the first nanopattern 1710 and the third nanopattern 1730 may have different diameters from the second nanopattern 1720.

In an embodiment, the diameter $m1$ of the first nanopattern 1710 formed on the first wavelength region WA1 that emits the first light L1 having a longer wavelength than the second light L2 may be smaller than the diameter $rn2$ of the second nanopattern 1720, and the diameter $rn3$ of the third nanopattern 1730 formed on the third wavelength region WA3 that emits the third light L3 having a shorter wavelength than the second light L2 may be larger than the diameter $rn2$ of the second nanopattern 1720. In other words, the nanopatterns 1710, 1720, and 1730 formed on the semiconductor structure 3000 may decrease in diameter from the center of the semiconductor structure 3000 to the outside. Further, the diameters of the nanopatterns 1710, 1720, and 1730 may increase in a uniaxial direction traversing the center of the semiconductor structure 3000, and then decrease after passing the center thereof. In other words, the diameters of the nanopatterns 1710, 1720, and 1730 may increase from one or an end of one or an axis traversing the center of the semiconductor structure 3000 to the center thereof, but the diameters of the nanopatterns 1710, 1720, and 1730 may decrease from the center thereof to the other or another end of the one or an axis.

However, the disclosure is not limited thereto. In the drawing, the first nanopattern 1710, the second nanopattern 1720, and the third nanopattern 1730, having different diameters from each other, are shown, but the disclosure is not limited thereto, and a larger number of nanopatterns may be included. For example, in a case that the active material layer 3300 may include a larger number of regions emitting light of different wavelength bands, a larger number of nanopatterns may be formed.

Accordingly, the element rods ROD manufactured in a step to be described later may have different diameters from each other. Depending on the diameters of the first nano pattern 1710, the second nano pattern 1720, and the third nano pattern 1730, the element rods ROD formed in the first wavelength region WA1, the second wavelength region WA2, and the third wavelength region WA3 may have different diameters from each other and may include active material layers 3300 having different compositions from each other.

In the element rods ROD formed by etching the semiconductor structure 3000 in a direction perpendicular to the lower substrate layer 1000, different lattice strains may be applied to the active material layers 3300, respectively. In the element rods ROD including the active material layers 3300 having different compositions from each other, the active material has different lattice strains depending on the diameters of the element rods ROD, and the wavelength band of emitted light, for example, the first light L1 and the third light L3 may be shifted. In other words, the diameters of the nanopatterns 1710, 1720, and 1730 may be adjusted such that the wavelength of emitted light may be shifted depending on the wavelength band of the wavelength region WA.

Accordingly, the finally manufactured light emitting element, for example, the first light emitting element 301 manufactured in the first wavelength region WA1 by the first nanopattern 1710 may emit the second light L2 as light emitted from the element active layer 330 is blue-shifted, and the third light emitting element 303 manufactured in the third wavelength region WA3 by the third nanopattern 1730 may emit the second light L2 as light emitted from the element active layer 330 is red-shifted.

Next, as shown in FIGS. 10 to 13, the semiconductor structure 3000 may be etched according to the nanopatterns 1710, 1720, and 1730 of the etching pattern layer 1700 to form element rods ROD. The step of forming the element rods ROD may include a first etching step of vertically etching an area of the etching pattern layer 1700, in which the plurality of nanopatterns 1710, 1720, and 1730 may be spaced apart from each other, to pattern the etching mask layer 1600 and the conductive electrode material layer 3700 to form a first hole h1, a step of removing the etching pattern layer 1700, a second etching step of patterning the second conductive semiconductor layer 3200, the active material layer 3300, and the first conductive semiconductor layer 3100 along the first hole h1 to form a second hole h2, and a step of removing the etching mask layer 1600.

The step of forming the first hole h1 and the step of forming the second hole h2 may be performed by a general etching method. For example, as the etching method, dry etching, wet etching, reactive ion etching (ME), inductively coupled plasma reactive ion etching (ICP-RIE) may be used. In the case of dry etching, anisotropic etching may be possible, and thus it may be suitable for forming the hole h by vertical etching. In a case that using the above-described etching method, an etchant may be Cl2 or O2. However, the disclosure is not limited thereto.

In an embodiment, the semiconductor structure 3000 may be etched by a combination of dry etching and wet etching. For example, first, etching in the depth direction may be performed, and then the etched sidewall may be placed or disposed on a plane perpendicular to the surface through wet etching, for example, isotropic etching.

Then, the etching mask layer 1600 or etching pattern layer 1700 remaining on the vertically etched semiconductor structure 3000 may be removed to form element rods ROD. The etching mask layer 1600 or the etching pattern layer 1700 may be removed by a general method, for example, dry etching or wet etching.

As described above, the formed element rods ROD may have different diameters from each other according to the nanopatterns 1710, 1720, and 1730 having different diameters from each other in the etching pattern layer 1700, but the light emitted from the element rods ROD may have substantially the same wavelength band.

Meanwhile, in the step of forming the element rods ROD by etching the semiconductor structure 3000, different patterning processes from each other may be performed in addition to the first etching step and the second etching step, and one patterning process may be performed to pattern the first conductive semiconductor layer 3100 along the etching pattern layer 1700. However, the disclosure is not limited thereto.

Figure 14:
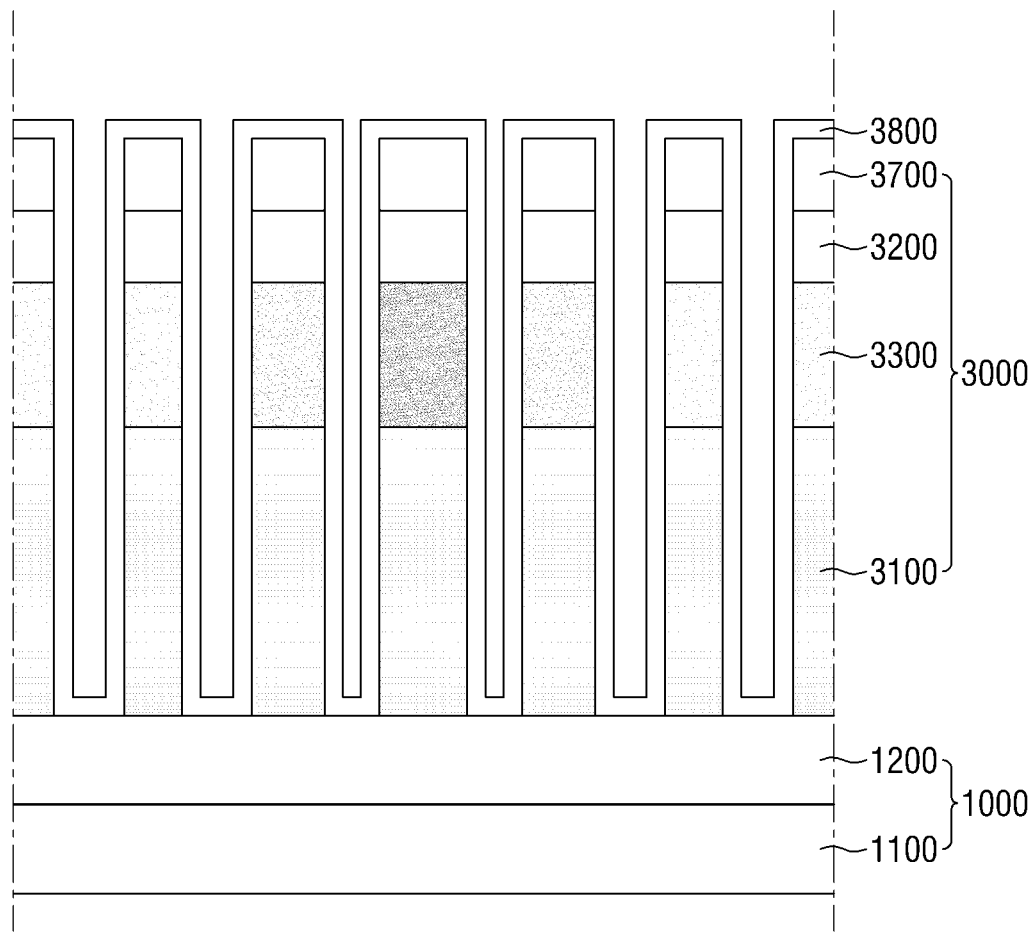
Figure 15:
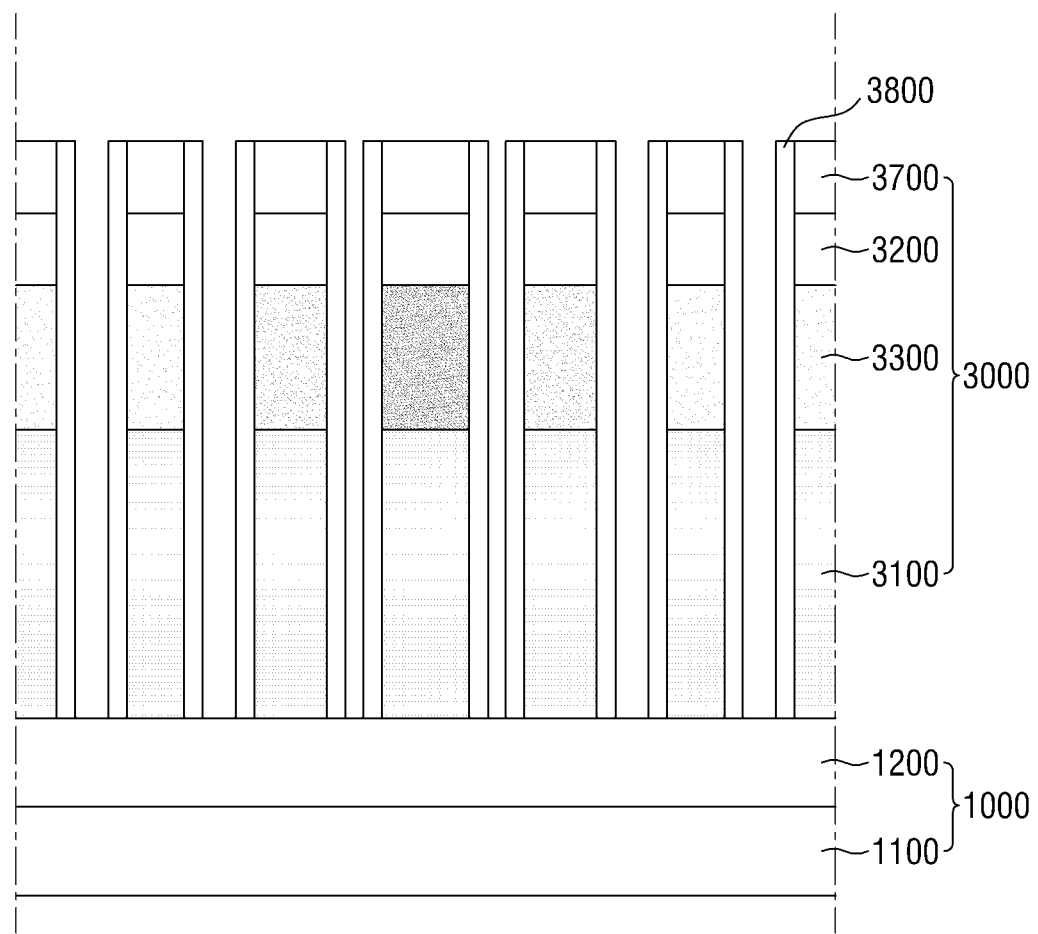
Figure 16:
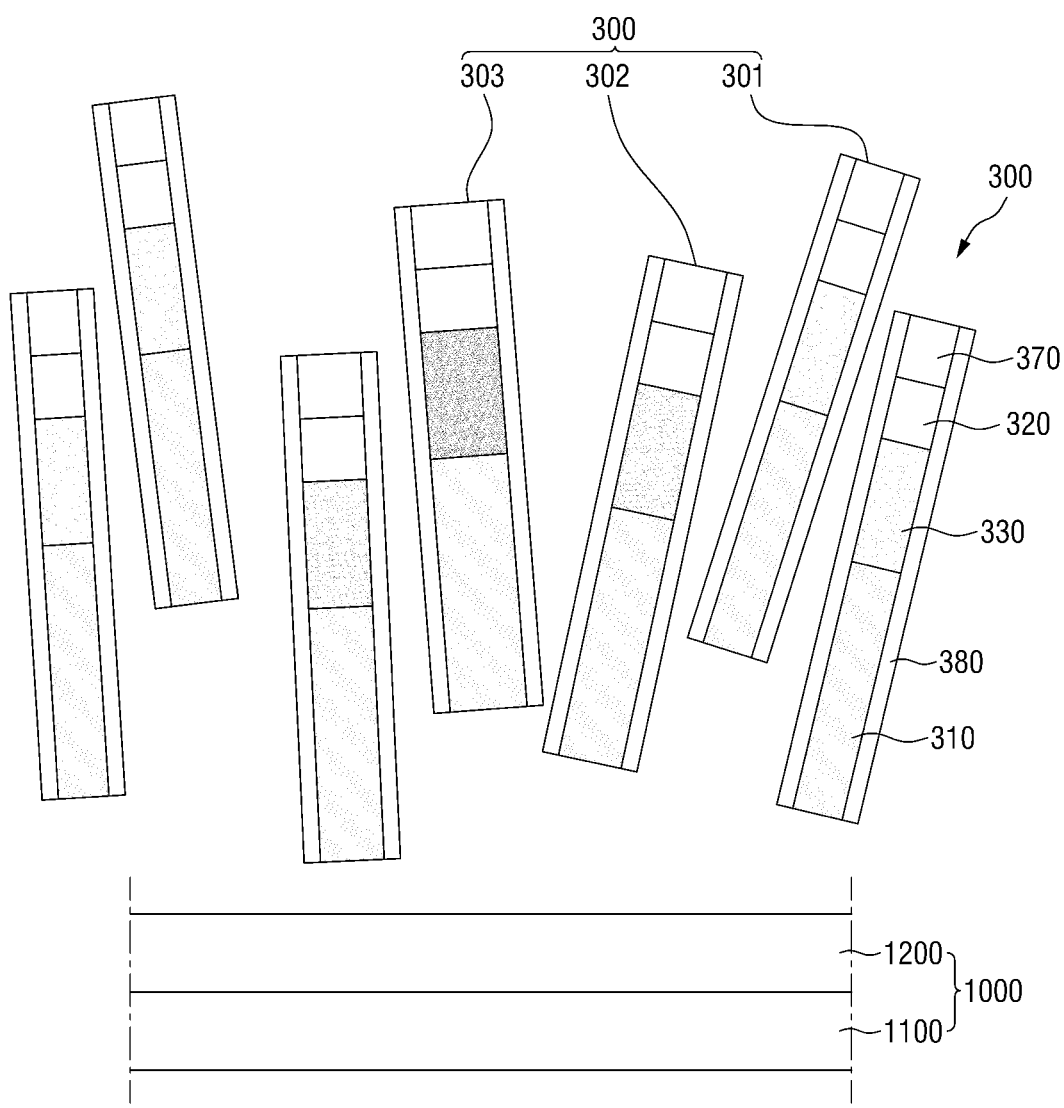

Next, referring to FIGS. 14 to 16, an insulating film 3800 partially surrounding the outer side surfaces of the element rods ROD is formed, and the element rods ROD may be separated from the lower substrate layer 1000 to manufacture the light emitting elements 300.

First, referring to FIGS. 14 and 15, the insulating film 3800 may be formed using a method of applying or immersing an insulating material on the outer surfaces of the vertically etched element rods ROD, but the disclosure is not limited thereto. For example, the insulating film 3800 may be formed by atomic layer deposition (ALD). The insulating layer 3800 may form the insulating layer 380 of the light emitting element 300. As described above, the insulating film 3800 may include silicon oxide (SiOx), silicon nitride (SiNx), silicon oxynitride (SiOxNy), aluminum oxide ($Al_2O_3$), or aluminum nitride (AlN).

Referring to FIG. 14, the insulating film 3800 may be formed on the side surfaces, upper surfaces and lower surfaces of the element rods ROD spaced apart from each other, and may thus be formed even on the buffer material layer 1200 exposed to the outside. In order to expose both end side surfaces of the element rod ROD, the insulating film 3800 formed on the upper surface of the element rod ROD needs to be removed. Accordingly, the insulating film 3800 formed in a direction perpendicular to the length direction of the element rod ROD, for example, in a direction parallel to the base substrate 1100 may be partially removed. For example, as shown in FIG. 15, at least the upper surface of the element rod ROD and the insulating film 3800 disposed on the buffer material layer 1200 may be removed to expose the upper surface of the element rod ROD. For this purpose, a process such as dry etching or etch back, which may be anisotropic etching, may be performed.

Finally, as shown in FIG. 16, the element rods ROD grown on the lower substrate layer 1000 may be separated from the lower substrate layer 1000, thereby manufacturing the light emitting elements 300.

In the step of separating the element rod ROD, the separation method is not particularly limited as long as it may be generally performed such as a physical separation method (Mechanically Lift Off (MLO)) or a chemical separation method (Chemically Lift Off (CLO)). However, according to an embodiment, in the method of manufacturing the light emitting element 300, a separation layer 1300 may be further disposed between the buffer material layer 1200 and the first conductive semiconductor layer 3100, and the separating layer 1300 may be removed by a chemical separation method (CLO) in the step of separating the element rods ROD. In order to remove the separation layer 1300, a wet etching process may be performed using a separation etchant such as hydrofluoric acid (HF) or buffered oxide etchant (BOE), but the disclosure is not limited thereto. Further, the light emitting element 300 manufactured by the chemical separation method (CLO) may maintain a flat and smooth end surface, and simultaneously, the plurality of light emitting elements 300 may secure uniformity of the end surface.

As shown in FIG. 16, the plurality of light emitting elements 300 may include a first light emitting element 301, a second light emitting element 302, and a third light emitting element 303, which have different diameters from each other. The light emitting elements 300 include the element active layers 330 having different compositions from each other and have different diameters from each other, and may thus emit light having the same wavelength band by shifting the wavelength of emitted light.

Although FIG. 16 shows only the first light emitting element 301, the second light emitting element 302, and the third light emitting element 303 having different diameters from each other, the disclosure is not limited thereto. In some cases, a larger number of light emitting elements 300 having different diameters from any light emitting element 300 may be included, and only two kinds of light emitting elements 300 having different diameters from each other may be included in a case that there may be fewer divisional regions formed on the active material layer 3300 due to a difference in composition.

As described above, in the method of manufacturing the light emitting element 300 according to an embodiment, the light emitting elements 300 having a difference in composition between the element active layers 330 but having different diameters from each other to emit light of substantially the same wavelength band may be manufactured. These light emitting elements 300 may be manufactured by forming etching pattern layers 1700 having different sizes from each other in the step of vertically etching the semiconductor structure 3000 to form elements rods ROD. Since the light emitting elements 300 according to an embodiment may be manufactured to have different diameters from each other, it may be possible to compensate for a difference in emission wavelength that may occur according to a difference in composition of the element active layer 330, and the display device 10 including the light emitting elements 300 may minimize a deviation in emission wavelength between the light emitting elements 300 in each pixel PX and improve color purity and light emission reliability of each pixel PX.

Meanwhile, in the step of forming the element rods ROD, the shape or placement of the etch pattern layer 1700 on the cross-section thereof may be various. The shape or displacement of the etching pattern layer 1700 may vary according to a division region formed due to a difference in composition of the semiconductor structure 3000 formed on the lower substrate layer 1000. Hereinafter, the shapes of etching pattern layers 1700 according to other embodiments will be described with reference to FIGS. 17 to 19.

Figure 17:
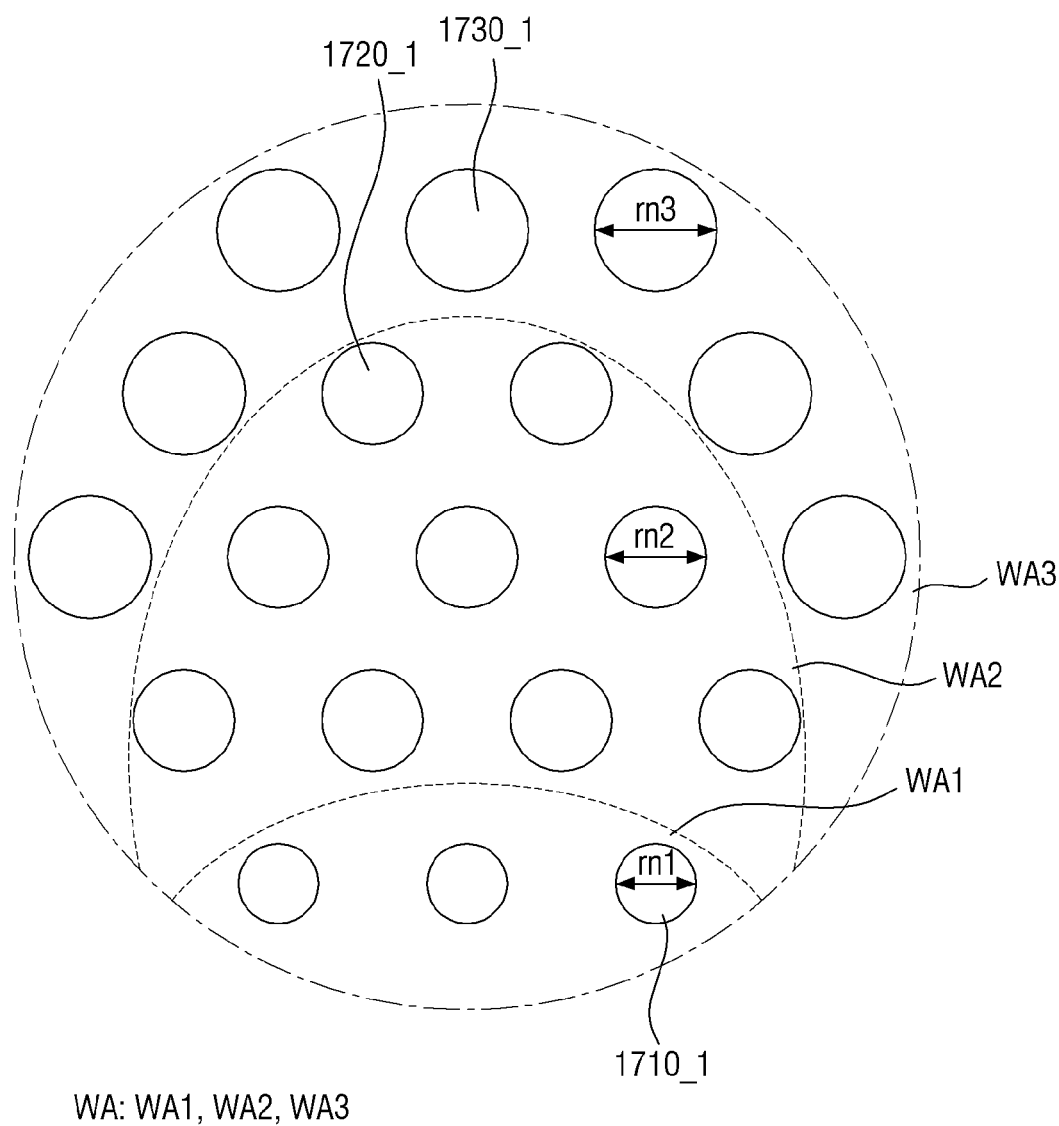
FIGS. 17 to 19 are plan views schematically illustrating a nanopattern according to an embodiment.

FIG. 17 is a schematic view illustrating a cross-sectional shape of an etching pattern layer formed on a semiconductor structure as viewed from above in the method of manufacturing a light emitting element according to an embodiment.

It is shown in FIG. 9 that the wavelength region WA formed on the semiconductor structure 3000 is changed from the center of the semiconductor structure 3000 to the outside. In this case, the nanopatterns 1710, 1720, and 1730 of the etching pattern layer 1700 may have different diameters from the center of the semiconductor structure 3000 to the outside.

In contrast, it is shown in FIG. 17 that the wavelength region WA formed on the semiconductor structure 3000 is changed from one or a side of the semiconductor structure 3000 to the other or another side thereof. In this case, nanopatterns 1710_1, 1720_1, and 1730_1 of the etching pattern layer 1700 may have different diameters from one or a side of the semiconductor structure 3000 to the other or another side thereof.

As described above, in a case that the semiconductor structure 3000 may be formed by depositing a precursor material on the lower substrate layer 1000, the distribution of the precursor material provided or disposed on the lower substrate layer 1000 may not be uniform. The arrangement of wavelength regions WA formed on the active material layer 3300 of the semiconductor structure 3000 may be changed according to the uniformity of the distribution of the precursor material.

In FIG. 17, a first wavelength region WA1 may be formed or disposed on one or a side of the semiconductor structure 3000, and a second wavelength region WA2 and a third wavelength region WA3 may be sequentially formed toward the other side thereof, for example, opposite side of the one or a side thereof. Accordingly, the arrangement of the nano patterns 1710_1, 1720_1, and 1730_1 formed or disposed on the semiconductor structure 3000 may also be changed.

The first nanopattern 1710_1 may be formed on the first wavelength region WA1, the second nanopattern 1720_1 may be formed on the second wavelength region WA2, and the third nanopattern 1730_1 may be formed on the third wavelength region WA3. Accordingly, based on one axial direction traversing the center on the semiconductor structure 3000, the diameters of the nanopatterns 1710_1, 1720_1, and 1730_1 may increase from one or a side to the other or another side. In other words, the diameters of the nano-patterns 1710_1, 1720_1, and 1730_1 may increase from one or an end of one axis traversing the center of the semiconductor structure 3000 to the other or another end thereof. However, the disclosure is not limited thereto, and vice versa. The shapes, arrangement structure, diameters, and the like of the nano patterns 1710, 1720, and 1730 may vary according to the wavelength region WA formed on the semiconductor structure 3000.

Figure 18:
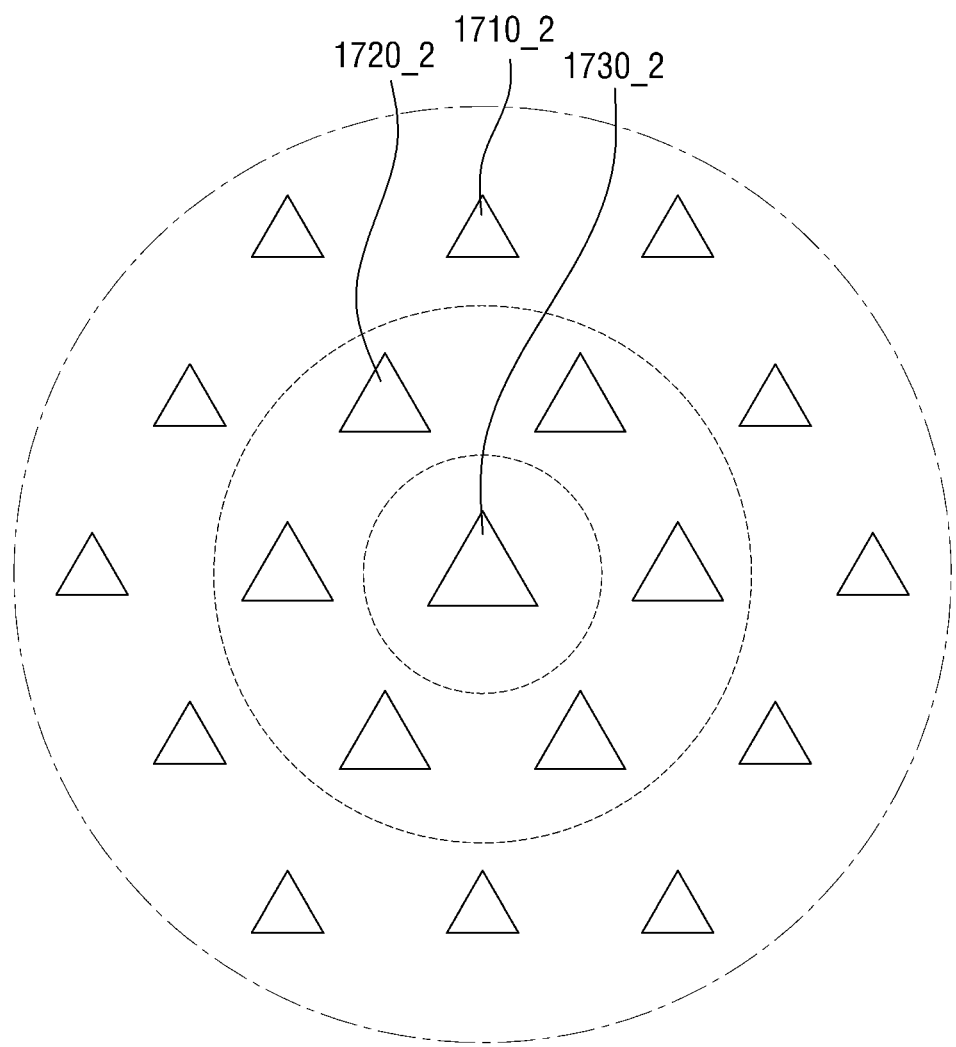
Figure 19:
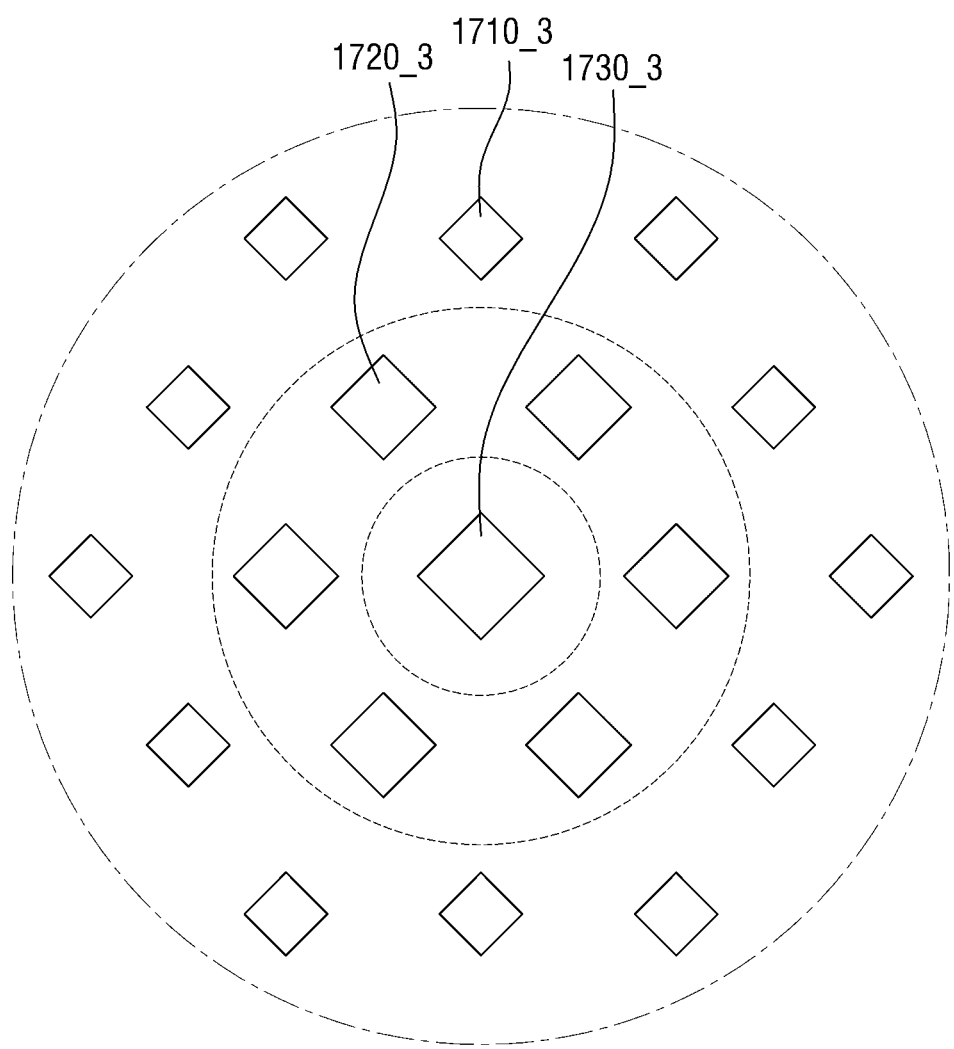

FIGS. 18 and 19 are schematic views illustrating cross-sectional shapes of etching pattern layers in the method of manufacturing a light emitting element according to an embodiment.

Referring to FIGS. 18 and 19, as described above, the nanopatterns 1710, 1720, and 1730 of the etching pattern layer 1700 do not necessarily have a substantially circular shape, and may have a substantially polygonal shape. It is shown in FIG. 18 that nanopatterns 1710_2, 1720_2, and 1730_2 have a substantially triangular shape, and it is shown in FIG. 19 that nanopatterns 1710_3, 1720_3, and 1730_3 have a substantially rhombus shape or a substantially rectangular shape. However, the disclosure is not limited thereto.

The light emitting elements 300 manufactured according to the nano patterns 1710, 1720, and 1730 of FIGS. 18 and 19 may have a substantially polygonal column shape. The light emitting element 300 may be aligned between the first electrode 210 and the second electrode 220 of the display device 10, and both ends thereof may be in contact with the contact electrodes 261 and 262. Accordingly, the light emitting element 300 may have various shapes within a range that does not cause adhesion failure in a case that the light emitting element 300 contacts the contact electrodes 261 and 262.

Figure 20:
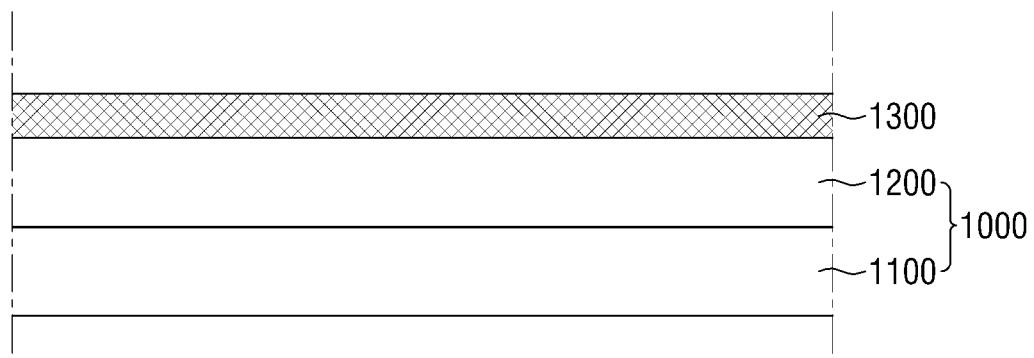
FIGS. 20 and 21 are schematic cross-sectional views illustrating processes of a method of manufacturing a light emitting element according to an embodiment.
Figure 21:
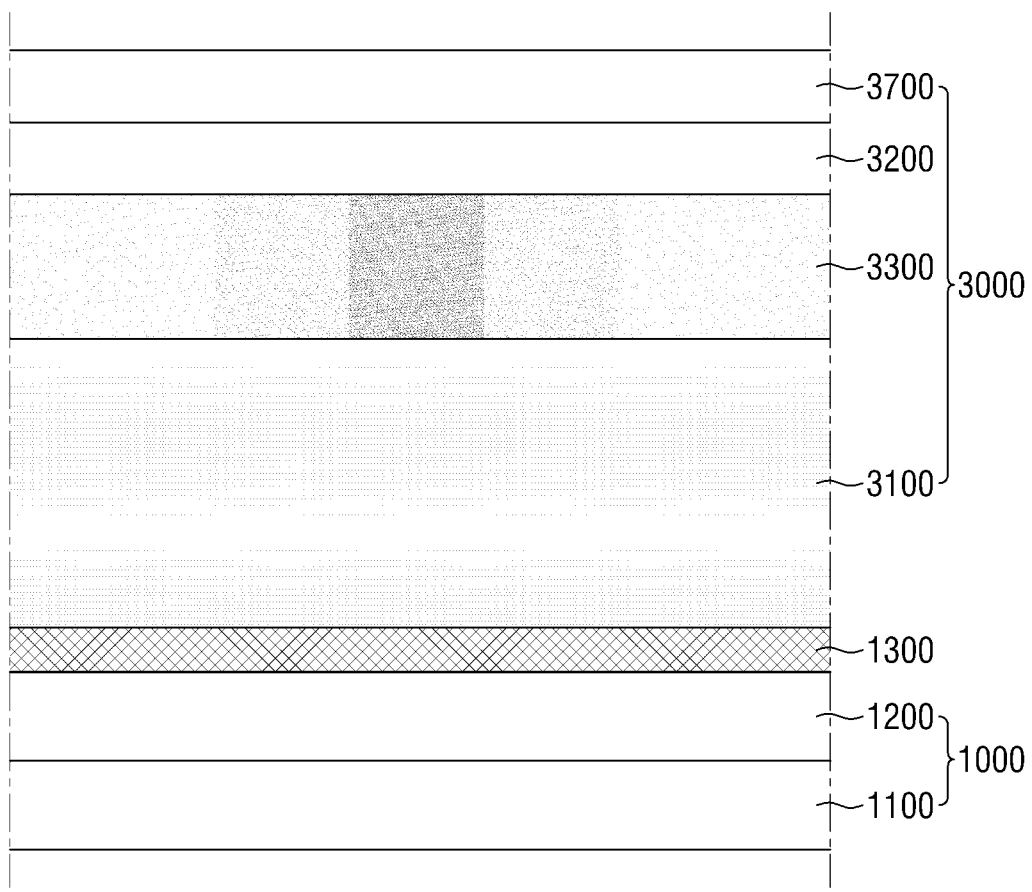

Meanwhile, as described above, in an embodiment, a plurality of layers may be formed or disposed on the buffer material layer 1200, and a separation layer 1300 may be disposed thereon. FIGS. 20 and 21 are schematic cross-sectional views illustrating processes of a method of manufacturing a light emitting element according to an embodiment.

Referring to FIGS. 20 and 21, a separation layer 1300 may be further disposed on the lower substrate layer 1000. The separation layer 1300 may have a first conductive semiconductor layer 3100 formed thereon. That is, the separation layer 1300 may be interposed between the first conductive semiconductor layer 3100 and the buffer material layer 1200, and the separation layer 1300 may include a material that grows crystals of the first conductive semiconductor layer 3100. The separation layer 1300 may include at least one of an insulating material and a conductive material. For example, the separation layer 1300 may include silicon oxide (SiOx), silicon nitride (SiNx), or silicon oxynitride (SiOxNy) as an insulating material, and may include ITO, IZO, IGO, ZnO, graphene, or graphene oxide as a conductive material. However, the disclosure is not limited thereto.

The separation layer 1300 may be etched and removed in a step to be described later, thereby separating the light emitting element 300 from the lower substrate layer 1000. The step of removing the separation layer 1300 may be performed by a chemical separation method (CLO) as described above, and thus the end surface of the light emitting element 300 may have substantially the same shape as the surface of the separation layer 1300. For example, the end surface of the light emitting element 300 may have a substantially flat surface.

Further, the separation layer 1300 may function as an etching stopper between the semiconductor structure 3000 and the buffer material layer 1200 in the process of etching the semiconductor structure 3000. For example, in a case that the semiconductor structure 3000 is etched, the separation layer 1300 may be simultaneously patterned in one process, and may also be separately patterned in another process. The method of manufacturing the light emitting element 300 is not particularly limited thereto.

However, the disclosure is not limited thereto. A larger number of separations layers 1300 may be arranged or disposed in the semiconductor structure 3000 or the lower substrate layer 1000, and the separation layer 1300 may be disposed in a region other than the interface between the buffer material layer 1200 and the first conductive semiconductor layer 3100.

In concluding the detailed description, those skilled in the art will appreciate that many variations and modifications can be made to the embodiments without substantially departing from the principles of the disclosure. Therefore, the disclosed embodiments are used in a generic and descriptive sense only and not for purposes of limitation.

What is claimed is:

1. A method of manufacturing a light emitting element, the method comprising:
   providing a semiconductor structure on a substrate, the semiconductor structure including different wavelength regions that emit light having different wavelength bands from each other;
   after the semiconductor structure is provided, measuring the semiconductor structure to determine the different wavelength regions that emit light having the different wavelength bands from each other;
   after measuring the semiconductor structure, forming nanopatterns spaced apart from each other on the semiconductor structure based on a respective wavelength region, the nanopatterns of each wavelength regions having different diameters from the nanopatterns of other wavelength regions, wherein a diameter of nanopatterns for each respective wavelength region is selected so as to cause different element rods formed from different wavelength regions to emit a common band of light; and
   etching the semiconductor structure to form the element rods.

2. The method of claim 1, wherein the wavelength regions include:
   a first wavelength region emitting a first light having a first wavelength band;
   a second wavelength region emitting a second light having a second wavelength band shorter than the first wavelength band; and
   a third wavelength region emitting a third light having a third wavelength band shorter than the second wavelength band.

3. The method of claim 2, wherein the forming of the nanopatterns includes forming a nanopattern having a large diameter on a wavelength region as a wavelength band of light emitted from the wavelength region decreases.

4. The method of claim 3, wherein
   the nanopatterns include:
      a first nanopattern;
      a second nanopattern having a larger diameter than a diameter of the first nanopattern; and
      a third nanopattern having a larger diameter than a diameter of the second nanopattern, and
   the forming of the nanopatterns includes:
      forming the first nanopattern on the first wavelength region;
      forming the second nanopattern on the second wavelength region; and
      forming the third nanopattern on the third wavelength region.

5. The method of claim 4, wherein the forming of the element rods includes: forming a first element rod in a region overlapping the first wavelength region;
   forming a second element rod in a region overlapping the second wavelength region; and
   forming a third element rod in a region overlapping the third wavelength region.

6. The method of claim 5, wherein
   the second element rod has a diameter larger than a diameter of the first element rod and smaller than a diameter of the third element rod, and
   the first element rod, the second element rod, and the third element rod emit light of substantially same wavelength band.

7. The method of claim 4, wherein
   the third wavelength region is disposed at a center of the semiconductor structure,
   the second wavelength region surrounds an outer surface of the third wavelength region, and
   the first wavelength region surrounds an outer surface of the second wavelength region.

8. The method of claim 7, wherein
   the semiconductor structure includes a first axis traversing the center of the semiconductor structure,
   a diameter of a nanopattern increases from an end of the first axis toward the center of the semiconductor structure, and
   a diameter of a nanopattern decreases from the center of the semiconductor structure toward another end of the first axis traversing the center of the semiconductor structure.

9. The method of claim 4, wherein
   the semiconductor structure includes a second axis traversing the center of the semiconductor structure,
   the first wavelength region is disposed at an end of the second axis,
   the second wavelength region partially surrounds an outer surface of the first wavelength region and extends in a direction of another end of the second axis, and the third wavelength region partially surrounds an outer surface of the second wavelength region and extends to the another end of the second axis of the semiconductor structure.

10. The method of claim 9, wherein a diameter of at least one nanopattern disposed along the second axis increases from the end of the second axis toward the another end of the second axis.

11. A method of manufacturing a light emitting element, the method comprising:
   providing a semiconductor structure disposed on a substrate and including a first conductive semiconductor layer, an active material layer, and a second conductive semiconductor layer;
   forming an etching mask layer on the semiconductor structure and one or more etching pattern layers of different diameters and spaced apart from each other on the etching mask layer;
   etching the semiconductor structure in a direction perpendicular to the substrate along a region where nanopatterns are spaced apart from each other to form element rods; and
   separating the element rods from the substrate to form light emitting elements, wherein
   the light emitting elements include:
      a first light emitting element having a diameter equal to the diameter of the first nanopattern;
      a second light emitting element having a diameter equal to the diameter of the second nanopattern; and
      a third light emitting element having a diameter equal to the diameter of the third nanopattern.

12. The method of claim 11, wherein the nanopatterns include:
   a first nanopattern;
   a second nanopattern having a larger diameter than a diameter of the first nanopattern; and
   a third nanopattern having a larger diameter than the diameter of the second nanopattern.

13. The method of claim 11, wherein a difference in diameter between the first light emitting element and the second light emitting element is in a range of about 2% to about 16% of the diameter of the second light emitting element.

14. The method of claim 13, wherein an interval between one or more nanopatterns spaced apart from each other is in a range of about 2.5 times to about 3.5 times the diameter of each of the nanopatterns.

15. The method of claim 14, wherein the nanopattern has a circular shape or a polygonal shape.

16. The method of claim 11, further comprising forming a separation layer between the first substrate and the first conductive semiconductor layer,
   wherein the forming of the light emitting elements includes removing the separation layer to separate the element rods from the substrate.

17. A display device, comprising:
   at least one first electrode and at least one second electrode disposed on a substrate, the at least one first electrode and the at least one second electrode extending in a first direction and spaced apart from each other in a second direction different from the first direction;
   at least one light emitting element disposed in a space between the at least one first electrode and the at least one second electrode;
   a first contact electrode partially overlapping the at least one first electrode and electrically contacting a first end of the at least one light emitting element; and
   a second contact electrode partially overlapping the at least one second electrode and electrically contacting a second end of the at least one light emitting element, the second end of the at least one light emitting element being opposite to the first end of the at least one light emitting element, wherein
   the at least one light emitting element includes a first light emitting element and a second light emitting element having a larger diameter than a diameter of the first light emitting element, and
   the first light emitting element and the second light emitting element emit light of substantially same wavelength band.

18. The display device of claim 17, wherein a difference in diameter between the first light emitting element and the second light emitting element is in a range of about 2% to about 16% of the diameter of the second light emitting element.

19. The display device of claim 18, wherein
   the at least one light emitting element includes a third light emitting element, and
   the third light emitting element has a larger diameter than the diameter of the second light emitting element and emits light of substantially same wavelength band as the second light emitting element.

* * * * *